United States Patent
Li et al.

(10) Patent No.: US 9,842,638 B1
(45) Date of Patent: Dec. 12, 2017

(54) DYNAMICALLY CONTROLLING VOLTAGE FOR ACCESS OPERATIONS TO MAGNETO-RESISTIVE RANDOM ACCESS MEMORY (MRAM) BIT CELLS TO ACCOUNT FOR PROCESS VARIATIONS

(71) Applicant: QUALCOMM Incorporated, San Diego, CA (US)

(72) Inventors: Xia Li, San Diego, CA (US); Xiaochun Zhu, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/414,855

(22) Filed: Jan. 25, 2017

(51) Int. Cl.
G11C 29/00 (2006.01)
G11C 11/16 (2006.01)

(52) U.S. Cl.
CPC ................. G11C 11/1697 (2013.01)

(58) Field of Classification Search
USPC ........................ 365/201, 157, 210.11, 210.12
See application file for complete search history.

(56) References Cited

U.S. PATENT DOCUMENTS

| | | | |
|---|---|---|---|
| 7,035,137 B2 | 4/2006 | Iwata et al. | |
| 7,145,824 B2 | 12/2006 | Bill et al. | |
| 7,405,589 B2 * | 7/2008 | Lewis | H03K 19/17784 326/38 |
| 8,693,238 B2 | 4/2014 | Sakimura et al. | |
| 9,076,542 B2 | 7/2015 | Sohn et al. | |
| 9,135,975 B2 | 9/2015 | Kim et al. | |
| 9,311,980 B1 | 4/2016 | Gogl et al. | |
| 9,378,797 B2 | 6/2016 | Antonyan | |
| 9,418,761 B2 | 8/2016 | Arslan et al. | |
| 9,502,088 B2 | 11/2016 | Jung et al. | |
| 2008/0002481 A1 * | 1/2008 | Gogl | G11C 5/02 365/189.06 |
| 2010/0157654 A1 * | 6/2010 | Jung | G11C 7/12 365/148 |
| 2016/0064058 A1 | 3/2016 | Janesky et al. | |

* cited by examiner

*Primary Examiner* — Vu Le
(74) *Attorney, Agent, or Firm* — Withrow & Terranova, PLLC

(57) ABSTRACT

Dynamically controlling voltage for access (i.e., read and/or write) operations to magneto-resistive random access memory (MRAM) bit cells to account for process variations is disclosed. An MRAM bit cell process variation measurement circuit (PVMC) is configured to measure process variations in MTJs that affect MTJ resistance, which can change write current at a given fixed supply voltage applied to an MRAM bit cell. The MRAM bit cell PVMC may also be configured to measure process variations in logic circuits representing process variations in access transistors employed in MRAM bit cells. These measured process variations in MTJs and/or logic circuits are used to dynamically determine a supply voltage for access operations to MRAM.

29 Claims, 19 Drawing Sheets

DYNAMICALLY CONTROLLING VOLTAGE FOR ACCESS OPERATIONS TO MAGNETO-RESISTIVE RANDOM ACCESS MEMORY (MRAM) BIT CELLS TO ACCOUNT FOR PROCESS VARIATIONS

BACKGROUND

I. Field of the Disclosure

The technology of the disclosure relates generally to magneto-resistive random access memory (MRAM), and more particularly to performing access operations in MRAM bit cells in MRAM.

II. Background

Semiconductor storage devices are used in integrated circuits (ICs) in electronic devices to provide data storage. One example of a semiconductor storage device is magneto-resistive random access memory (MRAM). MRAM is non-volatile memory in which data is stored by programming a magnetic tunnel junction (MTJ) as part of an MRAM bit cell. One advantage of MRAM is that MTJs in MRAM bit cells can retain stored information even when power is turned off. This is because data is stored in the MTJ as a small magnetic element rather than as an electric charge or current.

In this regard, an MTJ comprises a free ferromagnetic layer ("free layer") disposed above or below a fixed or pinned ferromagnetic layer ("pinned layer"). The free and pinned layers are separated by a tunnel junction or barrier formed by a thin non-magnetic dielectric layer. The magnetic orientation of the free layer can be changed, but the magnetic orientation of the pinned layer remains fixed or "pinned." Data can be stored in the MTJ according to the magnetic orientation between the free and pinned layers. When the magnetic orientations of the free and pinned layers are anti-parallel (AP) to each other, a first memory state exists (e.g., a logical '1'). When the magnetic orientations of the free and pinned layers are parallel (P) to each other, a second memory state exists (e.g., a logical '0'). The magnetic orientations of the free and pinned layers can be sensed to read data stored in the MTJ by sensing a resistance when current flows through the MTJ. Data can also be written and stored in the MTJ by applying a magnetic field to change the orientation of the free layer to either a P or AP magnetic orientation with respect to the pinned layer.

Recent developments in MTJ devices involve spin transfer torque (STT)-MRAM devices. In STT-MRAM devices, the spin polarization of carrier electrons, rather than a pulse of a magnetic field, is used to program the state stored in the MTJ (i.e., a '0' or a '1'). FIG. 1 illustrates an STT-MTJ device 100. The STT-MTJ device 100 is provided as part of an MRAM bit cell 102 to store non-volatile data. A metal-oxide semiconductor (MOS) (typically n-type MOS, i.e., NMOS) access transistor 104 is provided to control reading and writing to the STT-MTJ device 100. A drain (D) of the access transistor 104 is coupled to a bottom electrode 106 of the STT-MTJ device 100, which is coupled to a pinned layer 108 for example. A word line (WL) is coupled to a gate (G) of the access transistor 104. A source (S) of the access transistor 104 is coupled to a voltage source ($V_S$) through a source line (SL). The voltage source ($V_S$) provides a voltage ($V_{SL}$) on the source line (SL). A bit line (BL) is coupled to a top electrode 110 of the STT-MTJ device 100, which is coupled to a free layer 112 for example. The pinned layer 108 and the free layer 112 are separated by a tunnel barrier 114.

With continuing reference to FIG. 1, when writing data to the STT-MTJ device 100, the gate (G) of the access transistor 104 is activated by activating the word line (WL). A voltage differential between a voltage ($V_{BL}$) on the bit line (BL) and the voltage ($V_{SL}$) on the source line (SL) is applied. As a result, a write current (I) is generated between the drain (D) and the source (S) of the access transistor 104. If the magnetic orientation of the STT-MTJ device 100 in FIG. 1 is to be changed from AP to P, a write current ($I_{AP-P}$) flowing from the free layer 112 to the pinned layer 108 is generated. This induces a STT at the free layer 112 to change the magnetic orientation of the free layer 112 to P with respect to the pinned layer 108. If the magnetic orientation is to be changed from P to AP, a current ($I_{P-AP}$) flowing from the pinned layer 108 to the free layer 112 is produced, which induces an STT at the free layer 112 to change the magnetic orientation of the free layer 112 to AP with respect to the pinned layer 108.

As discussed above, a supply voltage can be applied across the MTJ in an MRAM bit cell to generate current for performing write operations. For example, this supply voltage may be a fixed supply voltage applied across an overall circuit and/or chip in which the MRAM is provided. In order to write to the MTJ, a write current ($I_w$) is generated to equal or exceed the critical switching current ($I_c$), which is the current required to switch the magnetic orientation of the free layer. In an STT-MTJ device, the $I_c$ required to switch the magnetic orientation of the free layer from P to AP is higher than the $I_c$ required to switch from AP to P. Thus, a higher supply voltage is employed to change the MTJ magnetization state from P to AP than from AP to P in a write operation. If the write current is below the critical switching current (i.e., $I_w < I_c$), the write current may not be sufficient to switch the state of the MTJ, resulting in a bit error. A bit error is a failed attempt to write the MTJ to an intended state. Since an MTJ is quantum mechanical in nature, the critical switching current is not a single theoretical value, but rather a distribution of values, where the probability of the MTJ switching its state increases as the current flowing across it increases. In order to reduce the risk of bit errors, a designed critical switching current can be selected along the critical switching current curve at a value higher than the theoretical critical switching current. The switching current margin is the difference between the designed critical switching current and the theoretical critical switching current. The design specifications of MRAM bit cells can thus provide a minimum switching current margin to avoid or mitigate erroneous data write operations such as bit errors.

Process variations can cause process corner variations that change the speed at which current flows through the access transistor 104 used to control write operations to the STT-MTJ device 100 in the MRAM bit cell 102 in FIG. 1. For example, process variations can vary the switching speed of the access transistor 104 in the MRAM bit cell 102 in FIG. 1 between typical, typical (TT), fast, fast (FF), and slow, slow (SS). If for example, process variations result in the access transistor 104 having higher impurity levels (i.e., a slow transistor), a higher gate voltage may be required to raise the write current to the designed critical switching current in order to avoid bit errors. However, as voltage increases so does power, which can cause the access transistor 104 to rise in temperature. Such increases in temperature can result in damage to the gate oxide of the access transistor 104 through mechanisms such as breakdown and time-dependent dielectric breakdown. In the opposite case, a fast access transistor 104 can require a lower gate voltage in order to lower the write current to the designed critical switching current. If the supply voltage is not lowered and the designed critical switching current is exceeded, power consumption can become inefficient and the tunnel barrier 114 is overstressed by the write process.

IC designs that include MRAM may employ a fixed supply voltage with a larger corner overhead to cover for process variations that can vary switching current. One disadvantage to providing a larger corner overhead in supply voltage is that switching current margin is increased, which can overstress certain MTJs based on process corner variation and also damage gate oxides of access transistors. This voltage stress can ultimately result in the failure of both MTJs and access transistors. However, if the switching current margin is too low, the switching current may not be sufficient to perform a write operation, thus resulting in increased bit errors and reduced reliability.

SUMMARY OF THE DISCLOSURE

Aspects disclosed in the detailed description include dynamically controlling voltage for access (i.e., read and/or write) operations to magneto-resistive random access memory (MRAM) bit cells to account for process variations. Related devices, methods, and systems are also disclosed. MRAM bit cells in an MRAM each include a magnetic tunnel junction (MTJ) as a storage element and an access transistor. Read and write operations are performed by applying a voltage to the gate of the access transistor, which in turn allows a supply voltage to drive a current through the MTJ for performing read and write operations. Process variations in the fabrication of MRAM bit cells can lead to variations in both the resistance of MTJs and the switching speed of access transistors. At a fixed supply voltage, both of these process variations can result in generation of a switching current that is too low to reliably write a state to the MTJ. In response, a fixed supply voltage with a larger corner overhead could be provided to power the MRAM to account for process variations that can vary switching current to provide a switching current margin. However, if the switching current margin is too high, the MTJs in the MRAM can be overstressed and risk damaging the access transistors. However, if the switching current margin is too low, write operations may result in bit errors and reduced reliability.

Thus, exemplary aspects disclosed herein include dynamically controlling voltage for write operations to MRAM bit cells to account for process variations. In exemplary aspects, an MRAM bit cell process variation measurement circuit (PVMC) is provided to measure process variations in MRAM bit cells in an MRAM. The MRAM bit cell PVMC is configured to measure process variations in MTJs that affect MTJ resistance, which can change write current at a given fixed supply voltage applied to an MRAM bit cell. The MRAM bit cell PVMC may also optionally be configured to measure process variations in logic circuits that represent the process variations in access transistors employed in MRAM bit cells in the MRAM to determine variations in the switching speed (i.e., drive strength) of the access transistors. These measured process variations in the MTJs and/or logic circuits are used to dynamically control a supply voltage for access operations to the MRAM. In this manner, for example, switching current for write operations can be dynamically increased to account for switching current margins that are too low, thus reducing the likelihood of bit errors and reduced reliability. Further, as another example, switching current for write operations can also be dynamically decreased to account for switching current margins that are too high, thus reducing power consumption and the need for design overhead, and the risk of damaging MRAM bit cells due to voltage stress.

In this regard in one aspect, an MRAM bit cell PVMC for determining process variation in MRAM bit cells in an MRAM array is provided. The MRAM bit cell PVMC comprises a supply voltage input configured to receive a supply voltage coupled to the MRAM array. The MRAM bit cell PVMC further comprises an MTJ PVMC coupled to the supply voltage input. The MTJ PVMC comprises one or more MTJ circuits. Each of the one or more MTJ circuits comprises a measurement transistor of a MOS type of an access transistor in at least one MRAM bit cell in the MRAM array, and a measurement MTJ device of a type of the MTJ device in the at least one MRAM bit cell in the MRAM array. The measurement MTJ device is coupled to the measurement transistor. Each of the one or more MTJ circuits also comprises an MTJ measurement output. The MTJ PVMC is configured to generate, on the MTJ measurement output, a process variation measurement voltage signal representing process variation in the measurement transistor and the measurement MTJ device of the one or more MTJ circuits, representing process variation of the access transistor and the MTJ device in the at least one MRAM bit cell in the MRAM array, as a function of the supply voltage coupled to the MTJ PVMC.

In another aspect, an MRAM bit cell PVMC for determining process variation in MRAM bit cells in an MRAM array is provided. The MRAM bit cell PVMC comprises a means for coupling a supply voltage coupled to the MRAM array, to a means for measuring MTJ process variation. The means for measuring MTJ process variation comprises a means for generating an MTJ process variation measurement indictor representing process variation in a measurement transistor and process variation in a measurement MTJ device, representing process variation of an access transistor and an MTJ device in at least one MRAM bit cell in the MRAM array, as a function of the supply voltage.

In another aspect, a method of measuring process variation of MRAM bit cell in an MRAM array is provided. The method comprises receiving a supply voltage coupled to the MRAM array, and coupling the supply voltage from a supply voltage input to an MTJ PVMC. The MTJ PVMC comprises one or more MTJ circuits. Each of the one or more MTJ circuits comprises a measurement transistor of a MOS type of an access transistor in at least one MRAM bit cell in the MRAM array, and a measurement MTJ device of a type of an MTJ device in the at least one MRAM bit cell in the MRAM array. The measurement MTJ device is coupled to the measurement transistor. The method further comprises generating a process variation measurement voltage signal representing process variation in the measurement transistor and the measurement MTJ device of the one or more MTJ circuits, representing process variation of the access transistor and the MTJ device in the at least one MRAM bit cell in the MRAM array, as a function of the supply voltage coupled to the MTJ PVMC.

In another aspect, a memory system is provided. The memory system comprises a power management circuit configured to generate a supply voltage, and an MRAM array coupled to the supply voltage. The MRAM array is comprised of a plurality of MRAM bit cells. Each MRAM bit cell among the plurality of MRAM bit cells comprises an MTJ device coupled to an access transistor. The memory system further comprises an MRAM bit cell PVMC for determining process variation in the plurality of MRAM bit cells in the MRAM array. The MRAM bit cell PVMC comprises an MTJ PVMC. The MTJ PVMC comprises a supply voltage input configured to receive the supply voltage generated by the power management circuit, and one or more MTJ circuits. Each of the one or more MTJ circuits comprises a measurement transistor of a MOS type of the access transistor in at least one MRAM bit cell among the plurality of MRAM bit cells in the MRAM array, and a measurement MTJ device of a type of the MTJ device in the at least one MRAM bit cell among the plurality of MRAM bit cells in the MRAM array. The measurement MTJ device is coupled to the measurement transistor. The memory system further comprises an MTJ measurement output. The MTJ PVMC is configured to generate, on the MTJ measurement output, a process variation measurement voltage signal representing process variation in the measurement transistor and the measurement MTJ device on the one or more MTJ circuits, representing process variation of the access transistor and the MTJ device in the at least one MRAM bit cell among the plurality of MRAM bit cells in the MRAM array, as a function of the supply voltage coupled to the MTJ PVMC. The power management circuit is further configured to receive the process variation measurement voltage signal from the MRAM bit cell PVMC, and determine a supply voltage level based on the received process variation measurement voltage signal. The power management circuit is also further configured to dynamically generate the supply voltage at the determined supply voltage level.

DETAILED DESCRIPTION

Figure 1:
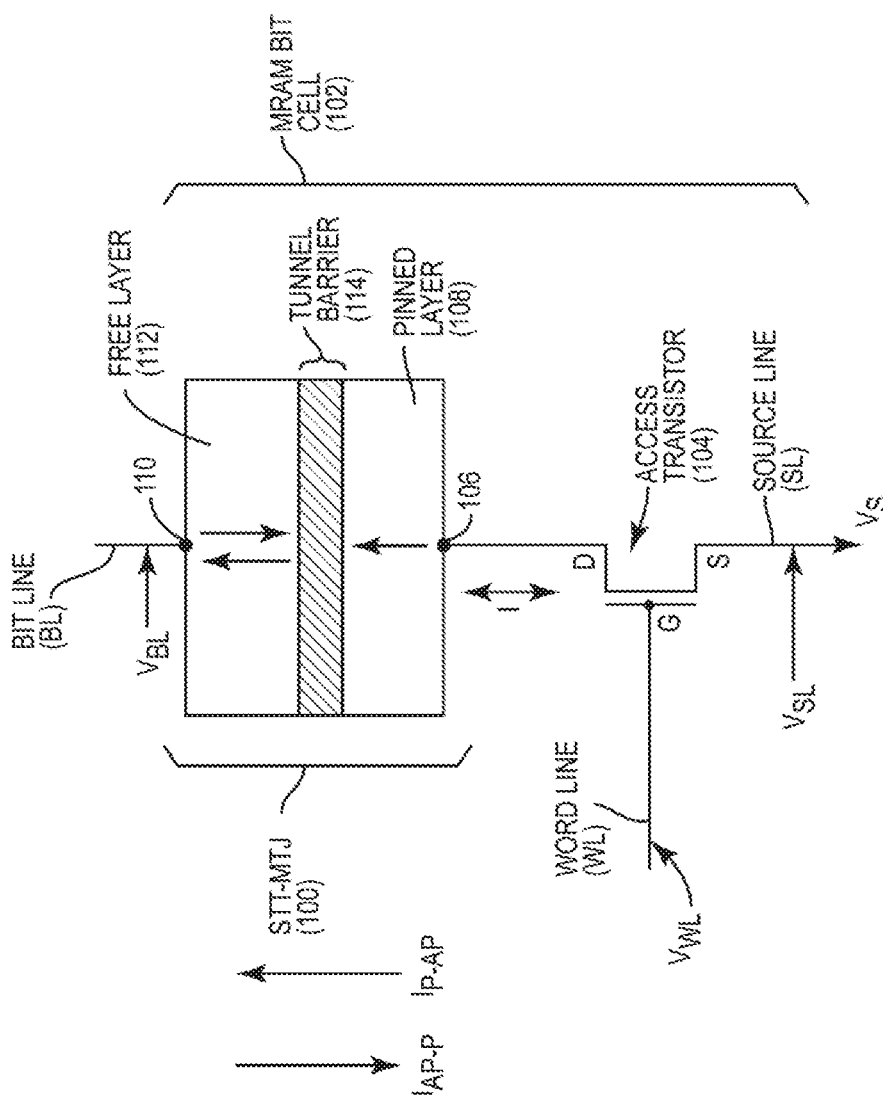
FIG. 1 is a schematic diagram of an exemplary magneto-resistive random access memory (MRAM) bit cell that can be provided in an MRAM array in an integrated circuit (IC)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include dynamically controlling voltage for access (i.e., read and/or write) operations to MRAM bit cells to account for process variations. In exemplary aspects, an MRAM bit cell process variation measurement circuit (PVMC) is provided to measure process variations in MRAM bit cells in an MRAM. The MRAM bit cell PVMC is configured to measure process variations in MTJs that affect MTJ resistance, which can change write current at a given fixed supply voltage applied to an MRAM bit cell. The MRAM bit cell PVMC may also optionally be configured to measure process variations in logic circuits that represent the process variations in access transistors employed in MRAM bit cells in the MRAM to determine variations in the switching speed (i.e., drive strength) of the access transistors. These measured process variations in the MTJs and/or logic circuits are used to dynamically control a supply voltage for access (i.e., write and read) operations to the MRAM. In this manner, for example, switching current for write operations can be dynamically increased to account for switching current margins that are too low, thus reducing the likelihood of bit errors and reduced reliability. Further, as another example, switching current for write operations can also be dynamically decreased to account for switching current margins that are too high, thus reducing power consumption and the need for design overhead, and the risk of damaging MRAM bit cells due to voltage stress. Also, dynamically controlling voltage for read operations can also overcome process variation for MRAM read circuits and bring such circuits closer to typical read conditions.

Figure 2:
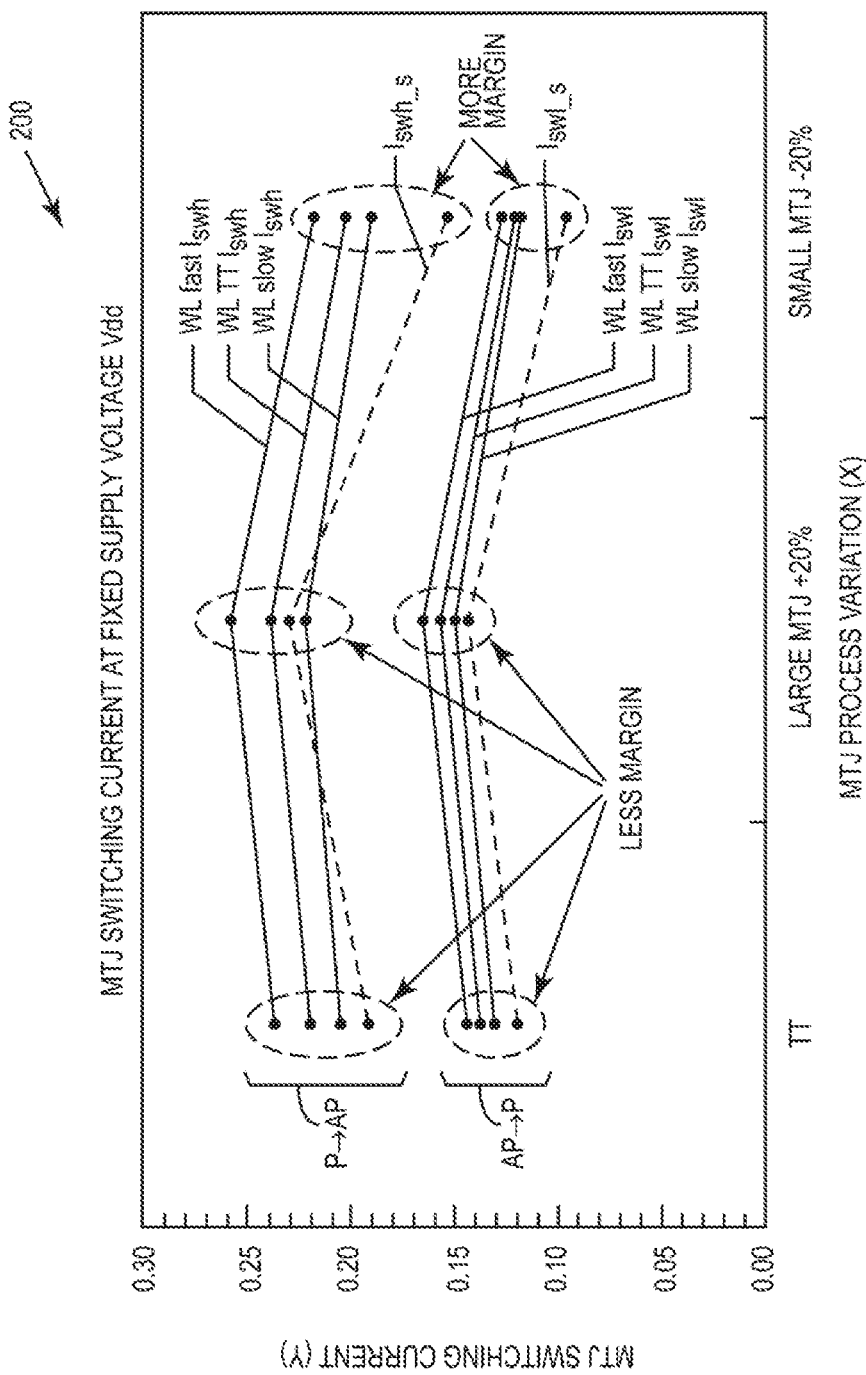
FIG. 2 is a graph illustrating exemplary switching current margin levels for writing to MRAM bit cells at a fixed supply voltage for different combinations of magnetic tunnel junction (MTJ) process variations and access transistor process variations.
Figure 3:
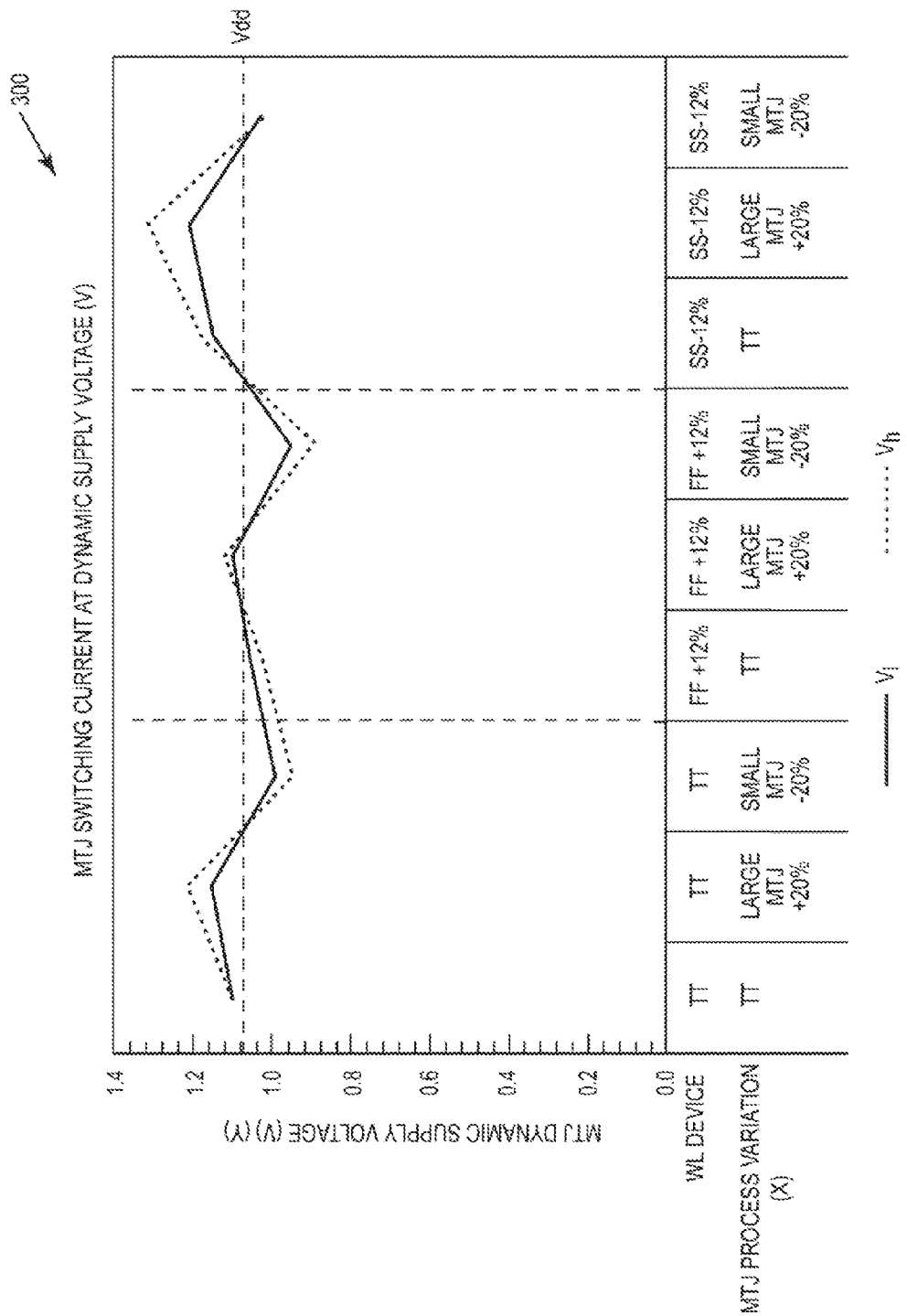
FIG. 3 is a graph illustrating an exemplary supply voltage dynamically generated by a supply voltage for conducting write operations to MRAM bit cells in MRAM to account for different combinations of MTJ process variations and access transistor process variations to reduce switching current margin without risking additional bit errors.
Figure 4:
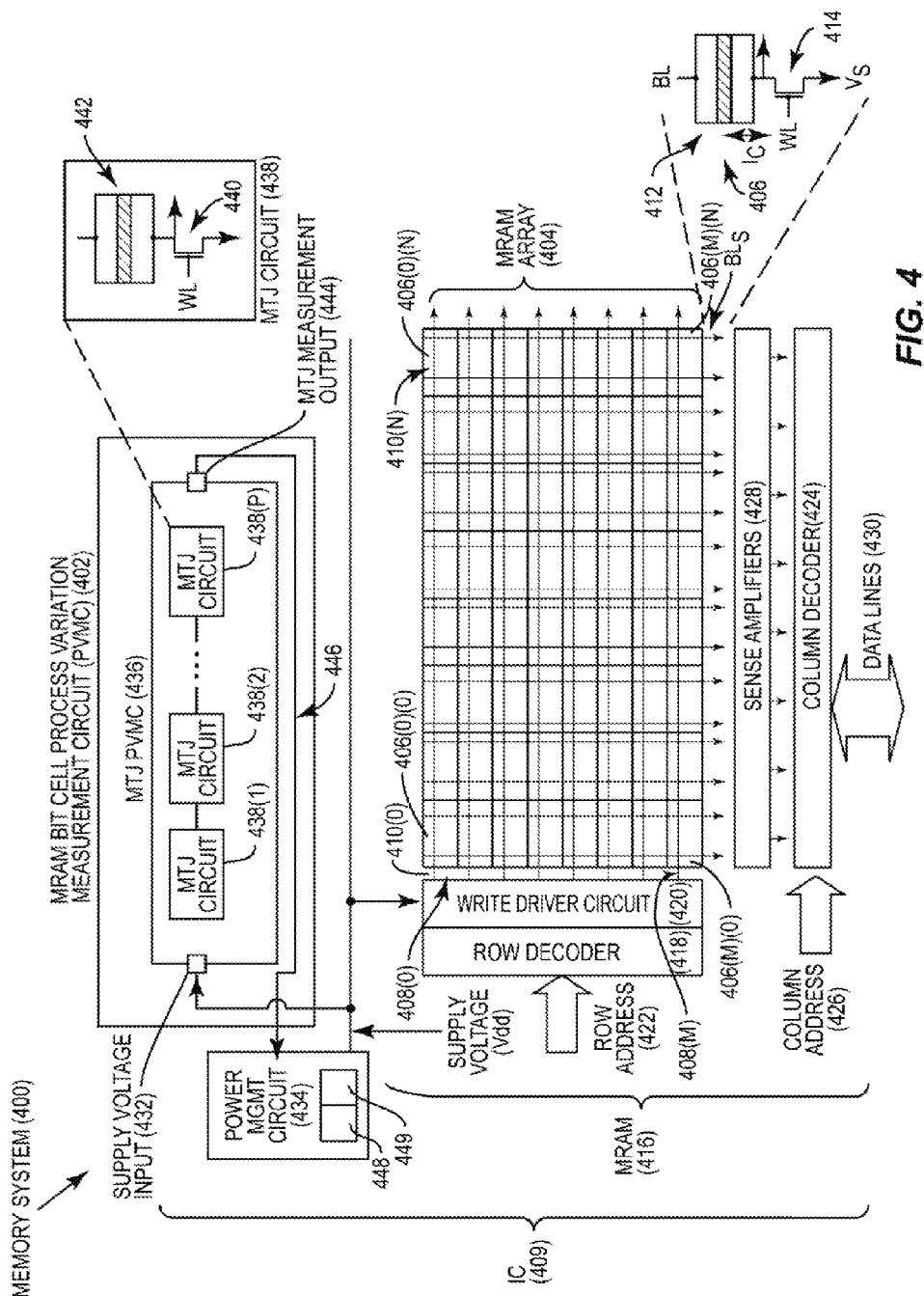
FIG. 4 is a schematic diagram of an exemplary memory system that includes an exemplary MRAM bit cell process variation measurement circuit (PVMC) configured to determine MTJ process variations in an MRAM array, which can be used by a power management circuit to dynamically control a supply voltage provided to the MRAM array for access operations to account for such process variations.

Before discussing exemplary MRAM bit cell PVMCs that are configured to measure process variations in MTJs and logic circuits that affect MTJ resistance and performance of access transistors employed by MRAM bit cells in an MRAM starting at FIG. 4, a discussion of process variations in MRAM bit cells affected by process variations in MTJs and logic circuits is first discussed with regard to FIGS. 2 and 3.

In this regard, FIG. 2 is a graph 200 illustrating exemplary switching current margin levels for writing to MRAM bit cells, such as the MRAM bit cell 102 in FIG. 1, at a fixed supply voltage Vdd for different combinations of MTJ process variations and access transistor process variations. As shown in FIG. 2, the X-axis (X) of the graph 200 illustrates MTJ process variation affecting the size of the MTJ to be typical, typical (TT), larger than typical (e.g., +20%), or smaller than typical (e.g., −20%). The Y-axis (Y) of the graph 200 illustrates MTJ switching current for a write operation in milliAmps (mA) as a function of the MTJ size and the access transistor performance, shown in this example as typical, typical (TT), slow, slow (SS), and fast, fast (FF) for both N-type metal oxide semiconductor (MOS) (NMOS) and P-type MOS (PMOS) devices. A TT MTJ switching current can be reduced when MTJ size is reduced. As shown in the graph 200, the MTJ switching current generated by an access transistor in an MRAM bit cell for the given fixed supply voltage Vdd varies based on the process variation of the access transistor affecting it being a TT, slow, or fast performance device as well as the process variation of the MTJ. For example, for a TT sized MTJ, the MTJ switching current generated as a result of the fixed supply voltage to switch the magnetization state of the MTJ to a low state (e.g., AP to P) is higher for a fast access transistor (WL fast Iswl), than for a typical access transistor (WL TT Iswl) and a slow access transistor (WL slow Iswl). Similarly, for TT sized MTJ, the MTJ switching current generated as a result of the fixed supply voltage to switch the magnetization state of the MTJ to a high state (e.g., P to AP) is higher for a fast access transistor (WL fast Iswh), than for a typical access transistor (WL TT Iswh) and a slow access transistor (WL slow Iswh). The current switching margin is the difference between the actual MTJ switching current generated as a result of the fixed supply voltage applied to the MRAM bit cell and a designed or specified switching current, which is shown as dashed lines Iswh_s and Iswl_s for switching the MTJ to a high and low state, respectively. If the switching current margin is too high, the MTJ in the MRAM bit cell can become overstressed and fail. However, if the switching current margin is too low, write operations may fail thus resulting in increased bit errors and reduced reliability.

Thus, IC designs that include MRAM may employ a fixed supply voltage with a larger corner overhead to cover for logic process variations that can vary the MTJ switching current. A larger corner overhead can be provided in the fixed supply voltage Vdd applied to MRAM to ensure that the current switching margin is sufficient for write operations to account for process variations of the access transistors. However, a larger fixed supply voltage Vdd may overstress certain MTJs based on their actual process corner variation and damage gate oxides of access transistors. However, if the fixed supply voltage Vdd is not increased to provide a sufficient switching current margin to account for process variations resulting in access transistors, the current switching margin that may fall outside of specifications leading to increased bit errors.

Alternatively, process variations that affect the access transistor may be determined to control the supply voltage to provide sufficient current switching margin based on access transistor performance without overstressing the MTJ. However, as also shown in FIG. 2, the size of the MTJ also affects the MTJ switching current generated as a result of the fixed supply voltage to switch the magnetization state of the MTJ to a low state (e.g., AP to P) and a high state (e.g., AP to P). A larger sized MTJ has a lower resistance than a smaller sized MTJ. Thus, as shown in the graph 200 in FIG. 2, for a given fixed supply voltage Vdd applied to an MRAM bit cell, the MTJ switching current will be larger for a larger sized MTJ (e.g., +20%) than a typical sized MTJ, and a smaller sized MTJ (e.g., −20%). Process variations that occur in the fabrication of MTJs can vary the size of the MTJ and thus affect the MTJ switching current generated as a result of the fixed supply voltage Vdd across an MRAM bit cell. For example, for a larger sized MTJ, the MTJ switching current generated as a result of the fixed supply voltage to switch the magnetization state of the MTJ for a given state is higher than for a smaller sized MTJ. Thus, even accounting for process variations in the access transistors to control the supply voltage Vdd applied to the MRAM bit cells may not provide a sufficient current switching margin to reduce or avoid bit errors without overstressing the MTJ.

Thus, in exemplary aspects disclosed herein, process variations in the fabrication of MTJ devices in MRAM bit cells that affect MTJ resistance, and thus can affect the switching current for write operations and read current for read operations, are determined. Process variations that can affect performance of access transistors employed in MRAM bit cells are also determined. These measured process variations in the MTJs and access transistors are both used to dynamically control a supply voltage for access operations to the MRAM. In this manner, as an example, the switching current for write operations can be dynamically increased to account for switching current margins that are too low based on the effect of process variations occurring in both the access transistor and the MTJ, thus reducing the likelihood of bit errors. Further, as another example, the switching current for write operations can also be dynamically decreased to account for switching current margins that are too high based on the effect of process variations occurring in both the access transistor and the MTJ, thus reducing power consumption and the need for design overhead, and the risk of damaging MRAM bit cells due to voltage stress. Also as another example, read current for read operations can be dynamically controlled to overcome process variation for MRAM read circuits and bring such circuits closer to typical read conditions.

In this regard, FIG. 3 is a graph 300 illustrating exemplary MTJ dynamic supply voltage (V) dynamically generated by a supply voltage for conducting write operations to MRAM bit cells in MRAM to account for different combinations of MTJ process variations and access transistor process variations to reduce switching current margin without risking additional bit errors. The MTJ dynamic supply voltage (V) is shown for both low state (Vl) and high state (Vh) write operations. The dynamically generated MTJ dynamic supply voltage (V) is shown on the Y-axis for a given MTJ process variation that accounts for both process variations in the access transistor (labeled "WL DEVICE") and the MTJ (labeled "MTJ PROCESS VARIATION") shown on the X-axis. Dynamically generating the MTJ dynamic supply voltage (V) for MTJ write operations is opposed to only generating a single, fixed supply voltage for MTJ operations, which is shown as voltage Vdd in the graph 300 in FIG. 3.

Thus, for example as shown in the graph 300 in FIG. 3, for a typical, typical (TT) access transistor, the MTJ dynamic supply voltage (V) can be increased if measured process variation of the MTJ indicates a larger MTJ having a lower resistance, and decreased if measured process variation of the MTJ indicates a smaller MTJ. The reason that the MTJ dynamic supply voltage (V) may need to be increased for a larger MTJ having a smaller resistance for a given access transistor performance is that a larger MTJ may require a larger switching current to change magnetization states. The increase in the MTJ dynamic supply voltage (V) may still be less than would otherwise be provided if the MTJ process variation was not measured to account for worst case current switching margin. Similarly, the reason that the MTJ dynamic supply voltage (V) may need to be decreased for a smaller MTJ having a higher resistance for a given access transistor performance is that a smaller MTJ may require less switching current to change magnetization states. MTJ dynamic supply voltage (V) can be increased if measured process variation of the MTJ indicates a larger MTJ having a lower resistance, and decreased if measured process variation of the MTJ indicates a smaller MTJ. As another example shown in the graph 300 in FIG. 3, for a slow, slow (SS) access transistor, the MTJ dynamic supply voltage (V) may need to be increased over a typical, typical (TT) access transistor for a given MTJ size, because the SS access transistor cannot drive as much current as the typical, typical (TT) access transistor. As yet another example shown in the graph 300 in FIG. 3, for a fast, fast (FF) access transistor, the MTJ dynamic supply voltage (V) may need to be decreased over a typical, typical (TT) access transistor for a given MTJ size, because the FF access transistor can drive more write current for a given supply voltage than the TT and SS access transistors.

Thus in summary, as shown in the graph 300 in FIG. 3, by determining the MTJ process variations for a given access transistor performance, the MTJ dynamic supply voltage (V) can be increased for larger sized MTJs and decreased for smaller sized MTJs. Further, as shown in the graph 300 in FIG. 3, by determining the logic process variations affecting access transistor performance, for a given MTJ size, the MTJ dynamic supply voltage (V) can be increased for slower access transistors and decreased for faster access transistors. In this manner, as one example, the switching current for MTJ write operations can be dynamically increased to account for process variations in the access transistors and MTJs in an MRAM bit cell that would otherwise cause switching current margins to be lower than design specifications for a fixed supply voltage, thus reducing the likelihood of bit errors. Further, as another example, the switching current for write operations can also be dynamically decreased to account for process variations in the access transistors and MTJs in an MRAM bit cell that would otherwise cause switching current margin to be higher than design specifications, thus reducing power consumption and the need for design overhead, and the risk of damaging MRAM bit cells due to voltage stress. Also, dynamically controlling voltage for read operations can overcome process variation for MRAM read circuits and bring such circuits closer to typical read conditions.

FIG. 4 is a schematic diagram of an exemplary memory system 400 that includes an exemplary MRAM bit cell PVMC 402. As will be discussed in more detail below, the MRAM bit cell PVMC 402 is configured to determine MTJ process variations representing MTJ process variations in MRAM bit cells in an MRAM array 404. The determined MTJ process variations in the MRAM array 404 can be used to dynamically control a supply voltage Vdd supplied to the MRAM array 404 for operation to provide a sufficient switching current for write operations while avoiding overstressing the MRAM array 404. The determined MTJ process variations in the MRAM array 404 can also be used to dynamically control the supply voltage Vdd supplied to the MRAM array 404 to balance read operations to overcome the impact of access transistor and MTJ process variations.

In this regard, the MRAM array 404 includes a plurality of MRAM bit cells 406(0)(0)-406(M)(N) to store data, wherein the MRAM bit cells 406(0)(0)-406(M)(N) are organized in M rows 408(0)-408(M) and N columns 410(0)-410(N). The MRAM bit cells 406(0)(0)-406(M)(N) may each include an MTJ device 412 coupled to an access transistor 414 similar to the STT-MTJ 100 in FIG. 1 for example. The MRAM array 404 is provided as part of an MRAM 416 that includes supporting circuitry to support read and write operations to the MRAM bit cells 406(0)(0)-406(M)(N). This supporting circuitry includes a row decoder 418 configured to activate a word line driver in a write driver circuit 420 to generate a word line (WL) to select a row of the MRAM bit cells 406(0)(0)-406(M)(N) based on a row address 422 for a memory access request. A column decoder 424 is provided that is configured to select a column N of the MRAM bit cells 406( )(0)-406( )(N) in the MRAM array 404 based on a column address 426. The MRAM bit cells 406(0)(0)-406(M)(N) accessed are those intersecting the selected row M and column N determined by the row decoder 418 and the column decoder 424. In a read operation, sense amplifiers 428 sense (i.e., read) a storage state of the selected MRAM bit cells 406(0)(0)-406(M)(N) from their respective bit lines (BLs) to provide the read data from the selected MRAM bit cells 406(0)(0)-406(M)(N) onto data lines 430.

With continuing reference to FIG. 4, read and write operations are performed by applying a supply voltage Vdd to the selected MRAM bit cells 406(0)(0)-406(M)(N), which in turn causes the access transistors 414 in the selected MRAM bit cells 406(0)(0)-406(M)(N) to drive a switching current Ic through their respective MTJ devices 412 for performing read and write operations. Process variations in the fabrication of the MRAM bit cells 406(0)(0)-406(M)(N) can lead to variations in both the resistance of their MTJ devices 412 and the switching speed of their access transistors 414. At a fixed supply voltage Vdd, these process variations can result in generation of the switching current Ic that is too low to reliably write a state to the MTJ devices 412. In response, a fixed supply voltage Vdd with a larger corner overhead could be provided to power the MRAM 416 to account for process variations that can vary switching current Ic to provide a desired switching current margin. However, if the switching current margin is too high, the MTJ devices 412 of the selected MRAM bit cells 406(0)(0)-406(M)(N) in the MRAM 416 may be overstressed and risk damaging their MTJ devices 412. However, if the switching current margin is too low, write operations may result in bit errors in the selected MRAM bit cells 406(0)(0)-406(M)(N) and reduce reliability.

In this regard, the MRAM bit cell PVMC 402 includes a supply voltage input 432 configured to receive the supply voltage Vdd generated by a power management circuit or chip 434 in this example. The power management circuit 434 may be provided as a power management integrated circuit (PMIC). The power management circuit 434 is configured to generate the supply voltage Vdd to provide power to consuming components of an IC 409 for operation, including the MRAM 416. The power management circuit 434 may be configured to adaptively control the voltage level of the supply voltage Vdd based on power consumption modes and/or performance parameters of the IC 409. In this example, the MRAM bit cell PVMC 402 includes an MTJ PVMC 436 coupled to the supply voltage input 432. In this manner, the MTJ PVMC 436 is powered by the same supply voltage Vdd as the MRAM array 404 so that the MTJ PVMC 436 can experience similar variations as a function of voltage. The MTJ PVMC 436 also includes one or more MTJ circuits 438(1)-438(P) configured to be powered by the supply voltage Vdd from the supply voltage input 432. As shown in FIG. 4, the MTJ circuits 438(1)-438(P) each include a measurement transistor 440 of a MOS type of an access transistor 414 included in at least one MRAM bit cell 406(0)(0)-406(M)(N) in the MRAM array 404. The MTJ circuits 438(1)-438(P) also each include a measurement MTJ device 442 of a type of an MTJ device 412 included in at least one MRAM bit cell 406(0)(0)-406(M)(N) in the MRAM array 404. Because the MTJ circuits 438(1)-438(P) are fabricated on the same die being part of the same IC 409 in this example, the measurement transistor 440 and the measurement MTJ device 442 will have the same or similar global process variations as in the access transistor 414 and MTJ device 412 of the MRAM bit cells 406(0)(0)-406(M)(N). Thus, the performance of the MTJ circuits 438(1)-438(P) can be measured to represent the process variations in the MRAM bit cells 406(0)(0)-406(M)(N) in the MRAM array 404, because the MTJ circuits 438(1)-438(P) should experience the same or similar performance as the MRAM bit cells 406(0)(0)-406(M)(N).

As an example, the measurement transistor 440 and the measurement MTJ device 442 in the MTJ circuits 438(1)-438(P) may also have the same or similar local process variations as in the access transistor 414 and MTJ device 412 of the MRAM bit cells 406(0)(0)-406(M)(N) depending on the layout location of the MTJ PVMC 436 relative to the MRAM array 404. For example, process variations in the fabrication of the MTJ device 412 may be a global process variation that varies the size of its stack layers in both the MTJ devices 412 in the MRAM bit cells 406(0)(0)-406(M)(N) as well as the measurement MTJ devices 442 in the MTJ circuits 438(1)-438(P). Generally, the larger the MTJ size, the lower its resistance, and vice versa—the smaller the MTJ size, the higher its resistance. Thus, for a given supply voltage Vdd applied across an MTJ circuit 438(1)-438(P), the switching current Ic will decrease for a smaller sized measurement MTJ device 442. The switching current Ic will increase for a larger sized measurement MTJ device 442.

Thus, with continuing reference to FIG. 4, the MTJ PVMC 436 includes an MTJ measurement output 444 coupled to the MTJ circuits 438(1)-438(P). The MTJ PVMC 436 is configured to generate on the MTJ measurement output 444, a process variation measurement voltage signal 446 indicating a process variation in a measurement transistors 440(1)-440(P) and process variation in a measurement MTJ devices 442(1)-442(P) of the MTJ circuits 438(1)-438(P). This measured process variation in the measurement transistors 440(1)-440(P) and process variation in the measurement MTJ devices 442(1)-442(P) of the MTJ circuits 438(1)-438(P) represents the process variation in the MRAM bit cells 406(0)(0)-406(M)(N) in the MRAM array 404, as a function of the supply voltage Vdd coupled to the MTJ PVMC 436. For example, the MTJ PVMC 436 may be configured to control the amplitude or frequency of process variation measurement voltage signal 446 as a function of process variation in the measurement MTJ devices 442(1)-442(P) of the MTJ circuits 438(1)-438(P), representing process variation in the MRAM bit cells 406(0)(0)-406(M)(N) in the MRAM array 404. The power management circuit 434 is configured to receive the process variation measurement voltage signal 446 from the MRAM bit cell PVMC 402. The power management circuit 434 is configured to determine a supply voltage level for the supply voltage Vdd based on the received process variation measurement voltage signal 446. The power management circuit 434 is then configured to dynamically generate the supply voltage Vdd at the determined supply voltage level. As will be discussed in more detail below, the power management circuit 434 may include a memory 448 configured to store parameters indicative of the MTJ process variation of the MRAM bit cells 406(0)(0)-406(M)(N) that can then be used to determine the supply voltage level to generate the supply voltage Vdd. The memory 448 can be one time programmable (OTP) memory as an example. Also as another example, the power management circuit 434 may include a counter 449 that is updated based on the received pulses in the received process variation measurement voltage signal 446, wherein the counter 449 can be reviewed as a function of time.

For example, if the effect of the determined process variations in the MRAM bit cells 406(0)(0)-406(M)(N) based on the received process variation measurement voltage signal 446 is that switching current Ic for a write operation will be reduced for a given supply voltage Vdd, the power management circuit 434 can dynamically increase the supply voltage Vdd to account for the switching current margins being too low, thus reducing the likelihood of bit errors. However, if the effect of the determined process variations in the MRAM bit cells 406(0)(0)-406(M)(N) based on the received process variation measurement voltage signal 446 is that switching current Ic for a write operation will be increased for a given supply voltage Vdd due to increased MTJ size, the power management circuit 434 can dynamically decrease the supply voltage Vdd to account for switching current margins that would otherwise be high enough to risk damaging the MRAM bit cells 406(0)(0)-406(M)(N) due to voltage stress. Further, dynamically controlling the supply voltage Vdd supplied to the MRAM array 404 reduces the need to provide for supply voltage overhead, thus reducing power consumption. Dynamically controlling the supply voltage Vdd supplied to the MRAM array 404 can also improve the operation margin of read circuits impacted by access transistor 414 and MTJ device 412 process variations.

Figure 5:
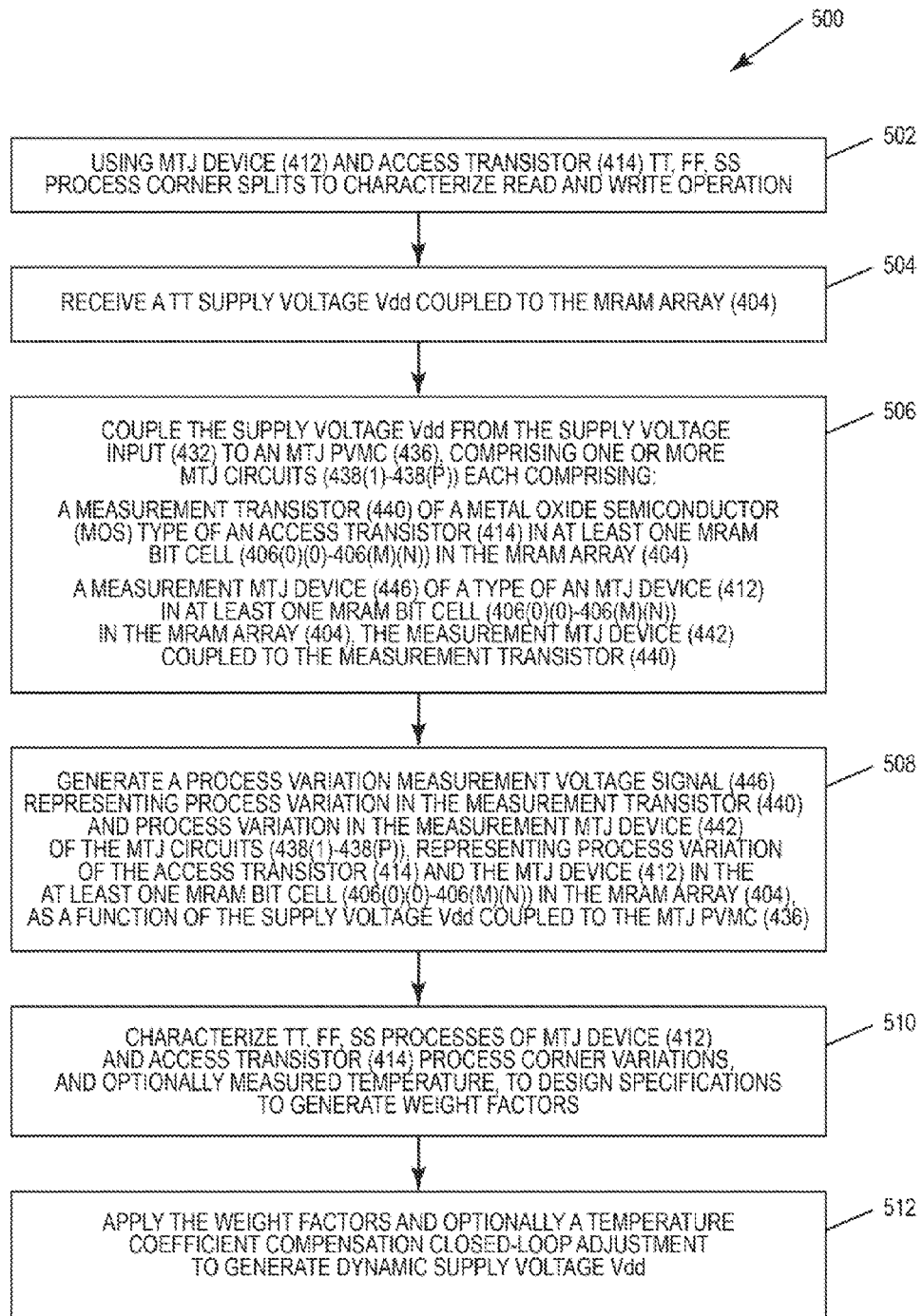
FIG. 5 is a flowchart illustrating an exemplary process that can be performed by the memory system in FIG. 4 for determining MTJ process variations in an MRAM array and dynamically controlling a supply voltage provided to the MRAM array for access operations to account for such process variations.

FIG. 5 is a flowchart illustrating an exemplary process 500 that can be performed by the memory system 400 in FIG. 4 for determining MTJ process variations in the MRAM array 404 and dynamically controlling the supply voltage Vdd provided to the MRAM array 404 for access (i.e., write and read) operations to account for such process variations. The TT, FF, SS process corner splits of the access transistor 414 and the MTJ device 412 in the MRAM array 404 are characterized for MRAM read and write operations (block 502). The MRAM bit cell PVMC 402 receives the TT supply voltage Vdd coupled to the MRAM array 404 on the supply voltage input 432 (block 504). The received supply voltage Vdd from the supply voltage input 432 is coupled to the MTJ PVMC 436, which comprises the one or more MTJ circuits 438(1)-438(P). The PVMC measurement data can be stored in the memory 448 of the power management circuit 434 such as an OTP memory (block 506). Each of the one or more MTJ circuits 438(1)-438(P) comprises the measurement transistor 440 of a MOS type of an access transistor 414 in at least one MRAM bit cell 406(0)(0)-406(M)(N) in the MRAM array 404. Each of the one or more MTJ circuits 438(1)-438(P) also comprises a measurement MTJ device 442 of a type of an MTJ device 412 in at least one MRAM bit cell 406(0)(0)-406(M)(N) in the MRAM array 404, wherein the measurement MTJ device 442 is coupled to the measurement transistor 440. The MTJ PVMC 436 is configured to generate the process variation measurement voltage signal 446 representing process variation in the measurement transistor 440 and process variation in the measurement MTJ device 442 of the MTJ circuits 438(1)-438(P), representing process variation of an access transistor 414 and an MTJ device 412 in the at least one MRAM bit cell 406(0)(0)-406(M)(N) in the MRAM array 404, as a function of the supply voltage Vdd coupled to the MTJ PVMC 436 (block 508).

With continuing reference to FIG. 5, the process variation measurement voltage signal 446 can be used to characterize TT, FF, SS processes of access transistor 414 and MTJ device 412 process corner variations and to generate weight factors for open-loop supply voltage generation for controlling the supply voltage Vdd (block 510). An optional temperature sensor measurement may also be employed to provide a compensation adjustment for closed-loop supply voltage Vdd generation. The cross process corners for write/read operation performance and power can be evaluated to meet design specifications and to fine tune the weight factors and temperature coefficients. Embedded weight factors and coefficients can then be stored in the memory 448 (block 510). The weight factors and optionally a temperature coefficient compensation can be used by the power management circuit 434 to generate a dynamic closed-loop adjustment to dynamically generate the supply voltage Vdd (block 512).

Figure 6:
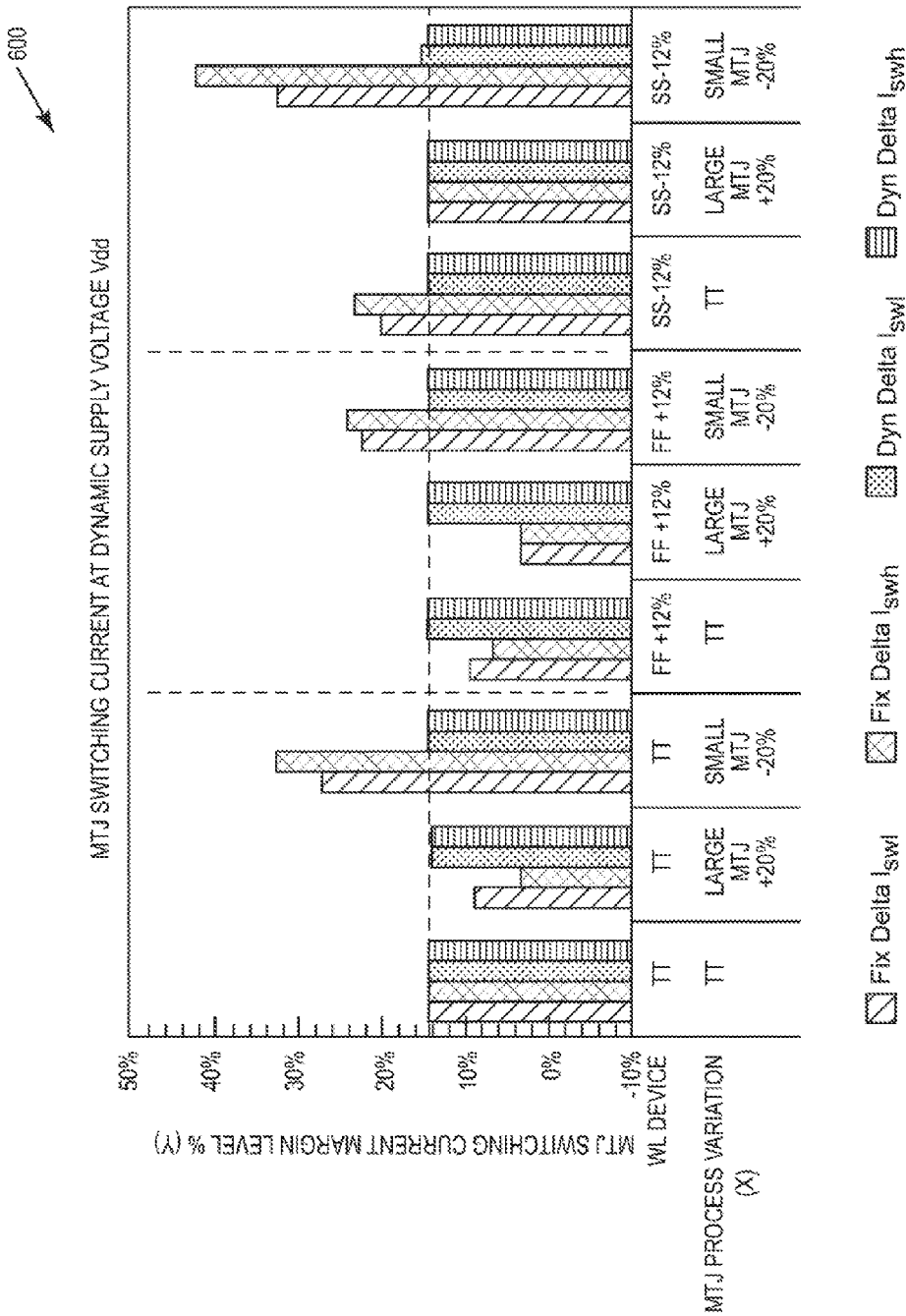
FIG. 6 is a graph illustrating an exemplary comparison of switching current margin level percentage deviations for write operations to the MRAM bit cells in the MRAM array in FIG. 4 at a fixed and dynamic supply voltage for different combinations of MTJ and access transistor process variations.

FIG. 6 is a graph 600 illustrating an exemplary comparison of switching current margin level percentage deviations for write operations to the MRAM bit cells 406(0)(0)-406(M)(N) in the MRAM array 404 in FIG. 4 at a fixed and dynamic supply voltage Vdd for different combinations of the MTJ device 412 and access transistor 414 process variations in the MRAM bit cells 406(0)(0)-406(M)(N). As shown in FIG. 6, the MTJ switching current margin level percentage (%) is shown on the Y-axis for a given MTJ process variation that accounts for both process variations in the access transistor (labeled "WL DEVICE") and the MTJ (labeled "MTJ PROCESS VARIATION") shown on the X-axis. The MTJ switching current margin level percentage (%) for a fixed supply voltage Vdd that is not dynamically controlled based on MTJ process variation is shown as bar graphs labeled "Fix Delta Iswl" and "Fix Delta Iswh" for switching to P and AP states, respectively. The MTJ switching current margin level percentage (%) for a supply voltage Vdd that is dynamically controlled by the power management circuit 434 based on the process variation measurement voltage signal 446 as a function on MTJ process variation in the MRAM bit cells 406(0)(0)-406(M)(N) is shown as bar graphs labeled "Dyn Delta Iswl" and "Dyn Delta Iswh," for switching to P and AP states, respectively. As shown, the MTJ switching current margin level percentage (%) is substantially the same across all MTJ process variations, because the power management circuit 434 is configured to dynamically adjust the supply voltage Vdd as a function of MTJ process variation to control the switching current Ic to achieve substantially the MTJ switching current margin level percentage (%).

As discussed above and illustrated in the memory system 400 in FIG. 4, the MRAM bit cell PVMC 402 includes the MTJ PVMC 436 that includes the MTJ circuits 438(1)-438

(P) each including both a measurement transistor 440 and a measurement MTJ device 442 to represent the access transistor 414 and MTJ device 412 in the MRAM bit cells 406(0)(0)-406(M)(N), respectively. Thus, the process variation measurement voltage signal 446 generated by the MTJ PVMC 436 will be a function of the MTJ process variation in the MTJ devices 412 and the access transistors 414 in the MRAM bit cells 406(0)(0)-406(M)(N) in the MRAM array 404. However, as shown in FIG. 6 for example, the switching current Ic generated in the MRAM bit cells 406(0)(0)-406(M)(N) for a write operation is a function of both MTJ process variation and logic process variation in this example. Thus, it may be desired to independently determine the MTJ process variation of the MTJ devices 412 in the MRAM bit cells 406(0)(0)-406(M)(N) separate from the logic process variation of the access transistors 414 in the MRAM bit cells 406(0)(0)-406(M)(N). In this manner, the effect of MTJ process variation on the switching current Ic can be determined and accounted for separately from the logic process variation. As will be discussed in more detail below, separately determining logic process variation from MTJ process variation allows the power management circuit 434 to dynamically adjust the supply voltage Vdd for access operations based on the specific switching state (AP to P or P to AP) for improved current switching margin performance.

Figure 7:
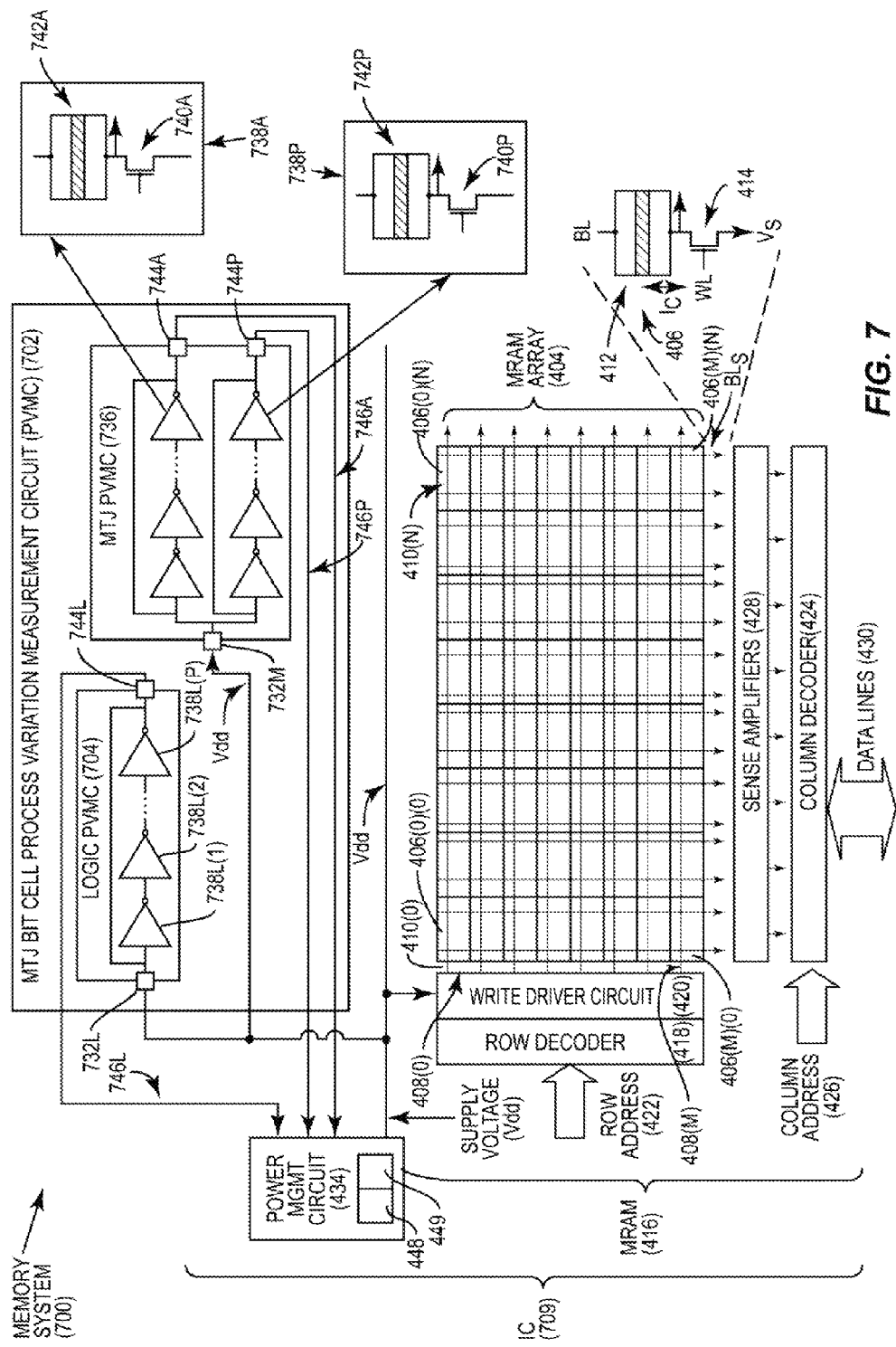
FIG. 7 is a schematic diagram of another exemplary memory system that includes an exemplary MRAM bit cell PVMC disposed in an IC with a separate logic PVMC and MTJ PVMC, wherein the MRAM bit cell PVMC is configured to determine MTJ and logic process variations representing MTJ and logic process variations in an MRAM array.

In this regard, FIG. 7 is a schematic diagram of another exemplary memory system 700. The memory system includes the MRAM 416 and power management circuit 434 in FIG. 4. Other common components between the memory system 700 in FIG. 7 and the memory system 400 in FIG. 4 are shown with common element numbers in FIGS. 4 and 7, and thus will not be redescribed.

The memory system 700 in FIG. 7 includes an exemplary MRAM bit cell PVMC 702. As will be discussed in more detail below, the MRAM bit cell PVMC 702 in this example includes a logic PVMC 704 that is configured to determine logic process variations representing logic process variations in MRAM bit cells 406(0)(0)-406(M)(N) in the MRAM array 404. The MRAM bit cell PVMC 702 in this example also includes an MTJ PVMC 736 that is configured to determine MTJ process variations representing MTJ process variations in MRAM bit cells 406(0)(0)-406(M)(N) in the MRAM array 404 for both high (P to AP) and low (AP to P) switching states. The determined logic and MTJ process variations for the MRAM array 404 can be used to dynamically control a supply voltage Vdd supplied to the MRAM array 404 for operation to provide a sufficient switching current for write operations while avoiding overstressing the MRAM 416.

Figure 8:
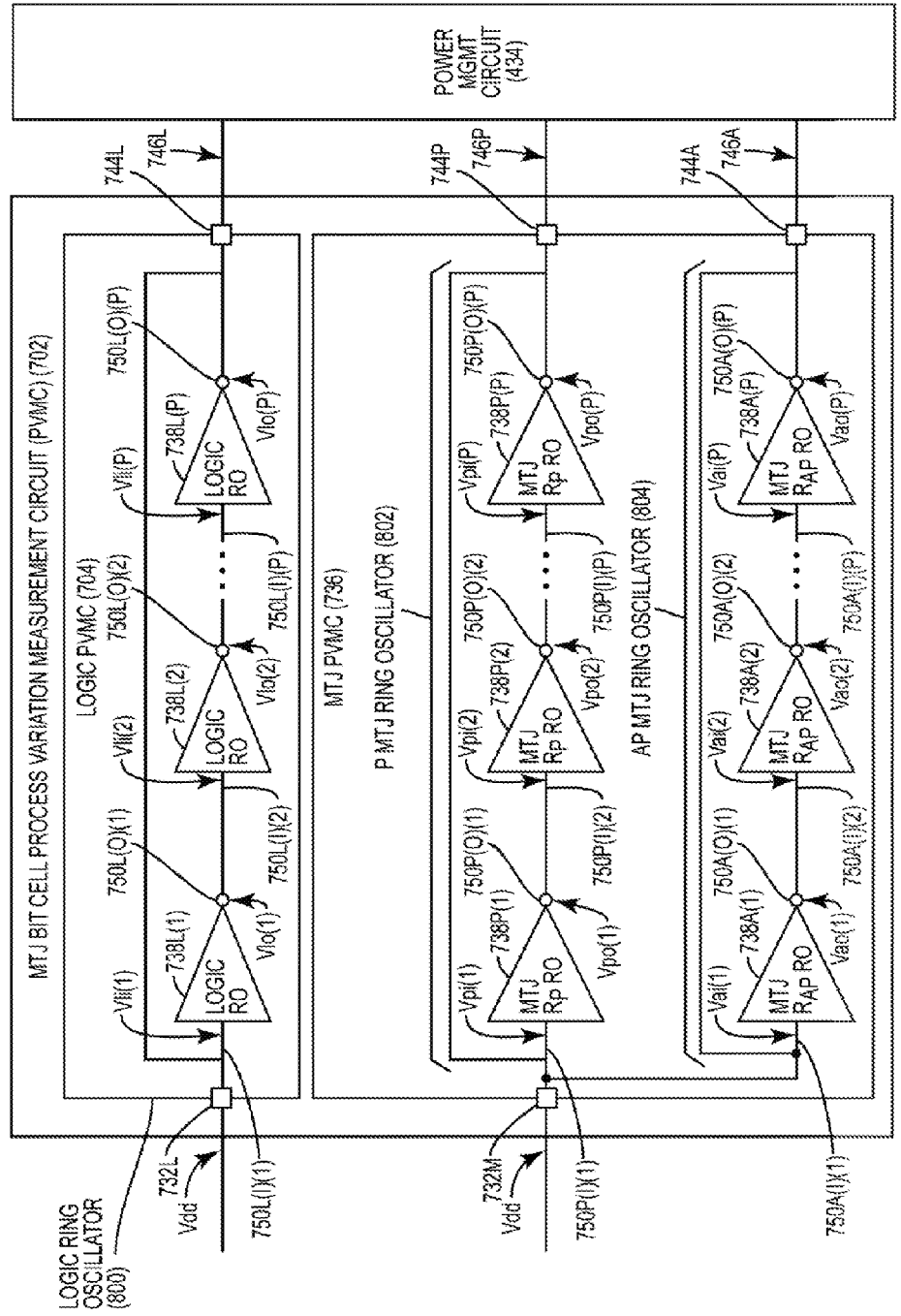
FIG. 8 is a schematic diagram of an exemplary MRAM bit cell PVMC that can be provided in the memory system in FIG. 7, wherein the MRAM bit cell PVMC includes a logic PVMC in the form of a logic ring oscillator circuit configured to measure logic process variations, and an MTJ PVMC that includes a parallel (P) MTJ ring oscillator circuit configured to measure MTJ process variations for a P magnetization state and an anti-parallel (AP) MTJ ring oscillator circuit configured to measure MTJ process variations for an AP magnetization state.

With continuing reference to FIGS. 7 and 8, the MRAM bit cell PVMC 702 includes an MTJ PVMC 736 coupled to a supply voltage input 732M. In this manner, the MTJ PVMC 736 is powered by the same supply voltage Vdd as the MRAM array 404 so that the MTJ PVMC 736 can experience similar variations as a function of voltage. As shown in FIG. 7, the MTJ PVMC 736 also includes one or more MTJ circuits 738P(1)-738P(P) in a P state that are configured to be powered by the supply voltage Vdd from the supply voltage input 732M. The MTJ circuits 738P(1)-738P(P) are configured as a P MTJ ring oscillator 802 in this example wherein P is an odd number that is three (3) or greater. Each MTJ circuit 738P(1)-738P(P) is configured to receive an MTJ input voltage Vpi(1)-Vpi(P) on an MTJ input node 750P(I)(1)-750P(I)(P) from an MTJ output node 750P(O)(2)-750P(O)(P), 750P(O)(1) of a preceding MTJ circuit 738P(1)-738(P). Each MTJ circuit 738P(1)-738(P) is configured to generate an MTJ output voltage Vpo(1)-Vpo(P) on a respective MTJ output node 750P(O)(1)-750P(O)(P) based on the received MTJ input voltage Vpi(1)-Vpi(P). The MTJ circuits 738P(1)-738P(P) are configured to be in a P magnetization state to measure MTJ process variation of the MRAM bit cells 406(0)(0)-406(M)(N), which are in a P magnetization state. As shown in FIG. 7, the MTJ circuits 738P(1)-738P(P) each include a measurement transistor 740P of a MOS type of an access transistor 414 included in at least one MRAM bit cell 406(0)(0)-406(M)(N) in the MRAM array 404. The MTJ circuits 738P(1)-738P(P) also each include a measurement MTJ device 742P of a type of an MTJ device 412 included in at least one MRAM bit cell 406(0)(0)-406(M)(N) in the MRAM array 404. Because the MTJ circuits 738P(1)-738P(P) are fabricated on the same die being part of a same IC 709 in this example, the measurement transistor 740P and the measurement MTJ device 742P will have the same or similar global process variations as in the access transistor 414 and MTJ device 412 of the MRAM bit cells 406(0)(0)-406(M)(N). Thus, the performance of the MTJ circuits 738P(1)-738P(P) can be measured to represent the MTJ process variations in the MRAM bit cells 406(0)(0)-406(M)(N) when in the P magnetization state, because the MTJ circuits 738P(1)-738P(P) should experience the same or similar performance as the MRAM bit cells 406(0)(0)-406(M)(N).

With continuing reference to FIGS. 7 and 8, the MTJ PVMC 736 also includes one or more MTJ circuits 738A(1)-738A(P) in an AP state that are configured to be powered by the supply voltage Vdd from the supply voltage input 732M. The MTJ circuits 738A(1)-738A(P) are configured to be in a AP magnetization state to measure MTJ process variations of the MRAM bit cells 406(0)(0)-406(M)(N), which are in an AP magnetization state. The MTJ circuits 738A(1)-738A(P) are configured as an AP MTJ ring oscillator 804 in this example, wherein P is an odd number that is three (3) or greater. Each MTJ circuit 738A(1)-738A(P) is configured to receive an MTJ input voltage Vai(1)-Vai(P) on an MTJ input node 750A(I)(1)-750A(I)(P) from an MTJ output node 750A(O)(2)-750A(O)(P), 750A(O)(1) of a preceding MTJ circuit 738A(1)-738A(P). Each MTJ circuit 738A(1)-738A(P) is configured to generate an MTJ output voltage Vao(1)-Vao(P) on a respective MTJ output node 750A(O)(1)-750A(O)(P) based on the received MTJ input voltage Vai(1)-Vai(P). As shown in FIG. 7, the MTJ circuits 738A(1)-738A(P) each include a measurement transistor 740A of a MOS type of an access transistor 414 included in at least one MRAM bit cell 406(0)(0)-406(M)(N) in the MRAM array 404. The MTJ circuits 738A(1)-738A(P) also each include a measurement MTJ device 742A of a type of an MTJ device 412 included in at least one MRAM bit cell 406(0)(0)-406(M)(N) in the MRAM array 404. Because the MTJ circuits 738A(1)-738A(P) are fabricated on the same die being part of the same IC 709 in this example, the measurement transistor 740A and the measurement MTJ device 742A will have the same or similar global process variations as in the access transistor 414 and MTJ device 412 of the MRAM bit cells 406(0)(0)-406(M)(N). Thus, the performance of the MTJ circuits 738A(1)-738A(P) can be measured to represent the MTJ process variations in the MRAM bit cells 406(0)(0)-406(M)(N) when in the AP magnetization state, because the MTJ circuits 738A(1)-738A(P) should experience the same or similar performance as the MRAM bit cells 406(0)(0)-406(M)(N).

With continuing reference to FIGS. 7 and 8, the logic PVMC 704 includes one or more logic circuits 738L(1)-738L(P) configured to be powered by the supply voltage Vdd from a supply voltage input 732L. The logic circuits 738L(1)-738L(P) are configured to measure the logic process variations of the MRAM bit cell 406(0)(0)-406(M)(N). For example, the logic circuits 738L(1)-738L(P) may include transistors of a MOS type of an access transistor 414 included in at least one MRAM bit cell 406(0)(0)-406(M)(N) in the MRAM array 404. Because the logic circuits 738L(1)-738L(P) are fabricated on the same die being part of the same IC 709 in this example, the logic circuits 738L(1)-738L(P) will have the same or similar global process variations as in the access transistor 414 and MTJ device 412 of the MRAM bit cells 406(0)(0)-406(M)(N). Thus, the performance of the logic circuits 738L(1)-738L(P) can be measured to represent the logic process variations in the MRAM bit cell 406(0)(0)-406(M)(N), because the logic circuits 738L(1)-738L(P) should experience the same or similar performance as the access transistors 414 in the MRAM bit cells 406(0)(0)-406(M)(N).

The logic circuits 738L(1)-738L(P) in this example are configured as a logic ring oscillator 800 in this example wherein P is an odd number that is three (3) or greater, and the logic circuits 738L(1)-738L(P) are each inverting logic circuits configured to generate an inverted output voltage state from an input voltage state. Each logic circuit 738L(1)-738L(P) is configured to receive a logic input voltage Vli(1)-Vli(P) on a logic input node 750L(I)(1)-750L(I)(P) from a logic output node 750L(O)(2)-750L(O)(P), 750L(O)(1) of a preceding logic circuit 738L(1)-738L(P). Each logic circuit 738L(1)-738L(P) is also configured to generate a logic output voltage Vlo(1)-Vlo(P) on the logic output node 750L(O)(1)-750L(O)(P) based on a respective logic input voltage Vli(1)-Vli(P). The logic PVMC 704 is configured to generate a logic process variation measurement voltage signal 746L based on the performance of the logic circuits 738(1)-738L(P) as affected by their process variations on the logic measurement output 744L. The logic process variation measurement voltage signal 746L indicates the process variation in the logic circuits 738L(1)-738L(P) representing the logic process variation of the access transistor 414 in the MRAM bit cells 406(0)(0)-406(N)(N). In this example, since the logic PVMC 704 is provided as a ring oscillator as shown in FIG. 8, the logic process variation measurement voltage signal 746L is also a voltage signal that has a frequency, wherein the frequency is a function of the logic process variation.

Figure 9A:
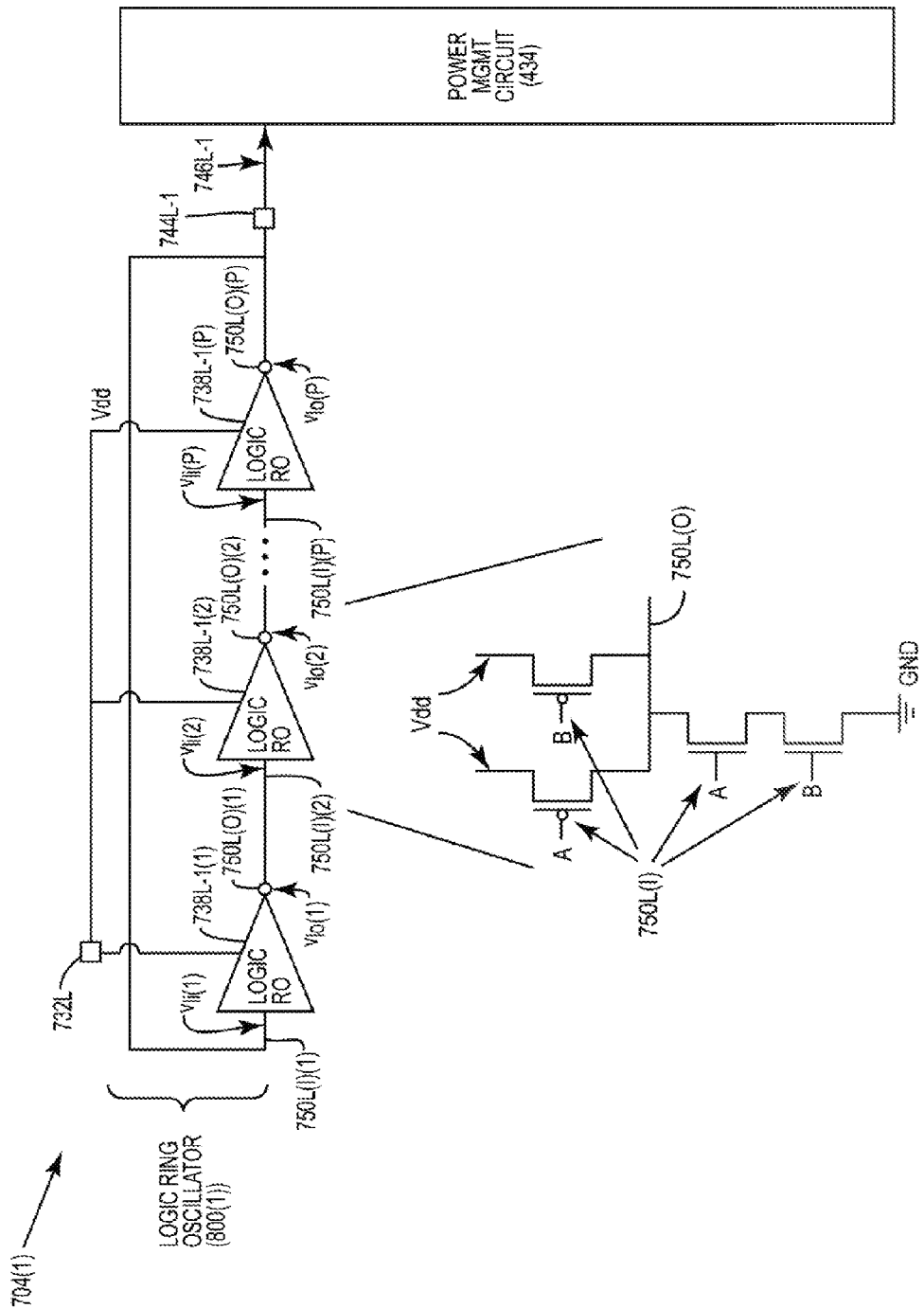
FIG. 9A is a schematic diagram of an exemplary logic ring oscillator circuit that can be employed as the logic ring oscillator circuit in the logic PVMC in FIG. 8 to measure process variations in logic circuits dominated by N-type metal oxide semiconductor (MOS) (NMOS) devices.
Figure 9B:
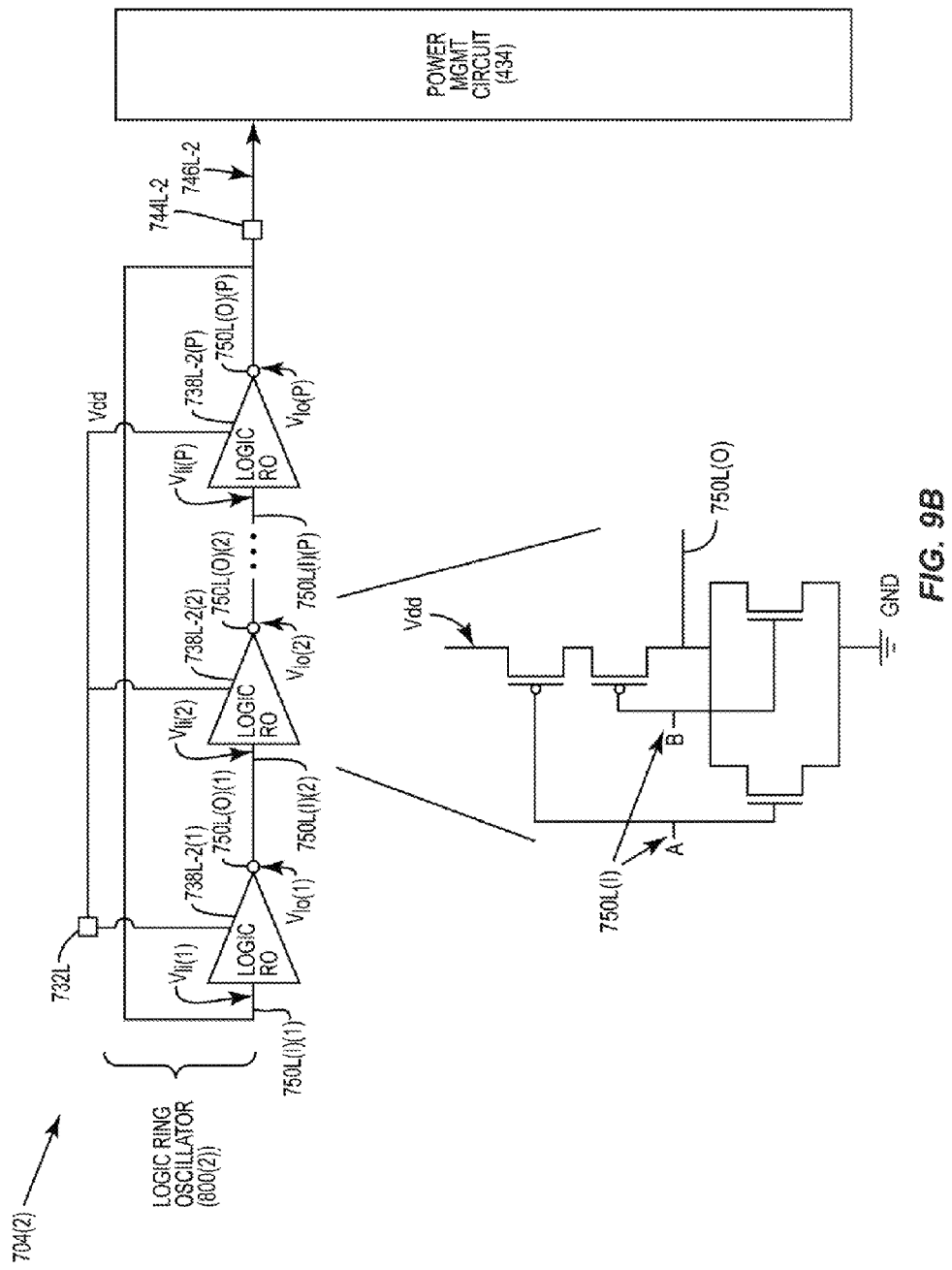
FIG. 9B is a schematic diagram of an exemplary logic ring oscillator circuit that can be employed as the logic ring oscillator circuit in the logic PVMC in FIG. 8 to measure process variations in logic circuits dominated by P-type MOS (PMOS) devices.

FIGS. 9A and 9B provide example of PVMC circuits that can be employed as the PVMC circuit 704 in FIG. 8. For example, as shown in FIG. 9A, if the process variation in the MRAM bit cells 406(0)(0)-406(M)(N) in FIG. 4 is dominated by NMOS transistors (e.g., the access transistors 414 are NMOS transistors), the logic PVMC 704(1) can be provided as a logic ring oscillator 800(1) that includes logic circuits 738L(1)-738L(P) provided as NAND logic circuits 738L-1(1)-738L-1(P). The logic ring oscillator 800(1) is configured to generate a logic process variation measurement voltage signal 746L-1 based on the performance of the NAND logic circuits 738L-1(1)-738L-1(P) as affected by their process variations on the logic measurement output 744L-1. As another example shown in FIG. 9B, if the process variation in the MRAM bit cells 406(0)(0)-406(M)(N) is dominated by PMOS transistors (e.g., the access transistors 414 are PMOS transistors), the logic PVMC 704(2) can be provided as a logic ring oscillator 800(2) that includes logic circuits 738L(1)-738L(P) provided as NOR logic circuits 738L-2(1)-738L-2(P). The logic ring oscillator 800(2) is configured to generate a logic process variation measurement voltage signal 746L-2 based on the performance of the NOR logic circuits 738L-2(1)-738L-2(P) as affected by their process variations on the logic measurement output 744L-2.

With continuing reference to FIGS. 7 and 8, the MTJ PVMC 736 includes MTJ measurement outputs 744P, 744A coupled to the respective MTJ circuits 738P(1)-738P(P) and 738A(1)-738A(P). The MTJ PVMC 736 is configured to generate on the MTJ measurement output 744P, a process variation measurement voltage signal 746P indicating the process variation in the measurement transistors 740P(1)-740P(P) and process variation in the measurement MTJ devices 742P(1)-742P(P) of the MTJ circuits 738P(1)-738P(P) in a P magnetization state, representing the MTJ process variation of the MRAM bit cells 406(0)(0)-406(N)(N) in a P magnetization state. The MTJ PVMC 736 is also configured to generate on the MTJ measurement output 744A, a process variation measurement voltage signal 746A indicating the process variation in the measurement transistor 740A(1)-740A(P) and process variation in the measurement MTJ devices 742A(1)-742A(1) of the MTJ circuits 738A(1)-738A(P) in an AP magnetization state, representing the MTJ process variation of the MRAM bit cells 406(0)(0)-406(N)(N) in an AP magnetization state. In this example, since the MTJ PVMC 736 is provided as ring oscillators as shown in FIG. 8, the process variation measurement voltage signals 746P, 746A are voltage signal that have a frequency, wherein the frequency is a function of process variation. The higher the frequency, the less delay in the respective MTJ circuits 738P(1)-738P(P), 738A(1)-738A(P) generating MTJ output voltages Vpo(1)-Vpo(P), Vao(1)-Vao(P) that alternate in voltage state between the supply voltage Vdd and ground to generate the process variation measurement voltage signals 746P, 746A as voltage frequency signals.

The power management circuit 434 is configured to receive the variation measurement voltage signals 746L, 746A, 746P from the MRAM bit cell PVMC 702. The power management circuit 434 is configured to determine a supply voltage level for the supply voltage Vdd based on the received variation measurement voltage signals 746L, 746A, 746P. The power management circuit 434 is then configured to dynamically generate the supply voltage Vdd at the determined supply voltage level based on the process variations indicated by the received variation measurement voltage signals 746L, 746A, 746P per process corner splits characterization weight factors and operationally temperature coefficients. As discussed above, the power management circuit 434 include the memory 448 that can be configured to store parameters indicative of the logic and MTJ process variations determined for the MRAM bit cells 406(0)(0)-406(M)(N) based on the process variation measurement voltage signals 746L, 746A, 746P that can then be used to determine the supply voltage level to generate the supply voltage level Vdd.

Also as will be discussed in more detail below, the power management circuit 434 can be configured to separately determine MTJ process variations separate from logic process variations determined for the MRAM bit cells 406(0)(0)-406(M)(N). In this regard, the logic process variation measurement voltage signal 746L represents only the effect of the logic process variation in the logic circuits 738L(1)-738L(P), which can be used in conjunction with the process variation measurement voltage signals 746A, 746P to determine the effect of the MTJ process variation alone in the MTJ circuits 738P(1)-738P(P) and 738A(1)-738A(P), for P and AP magnetization states, respectively. This may allow for generating the supply voltage Vdd without a lower switching current margin while achieving the same or improved bit error yield results and without overstressing the MRAM bit cells 406(0)(0)-406(M)(N).

Figure 10A:
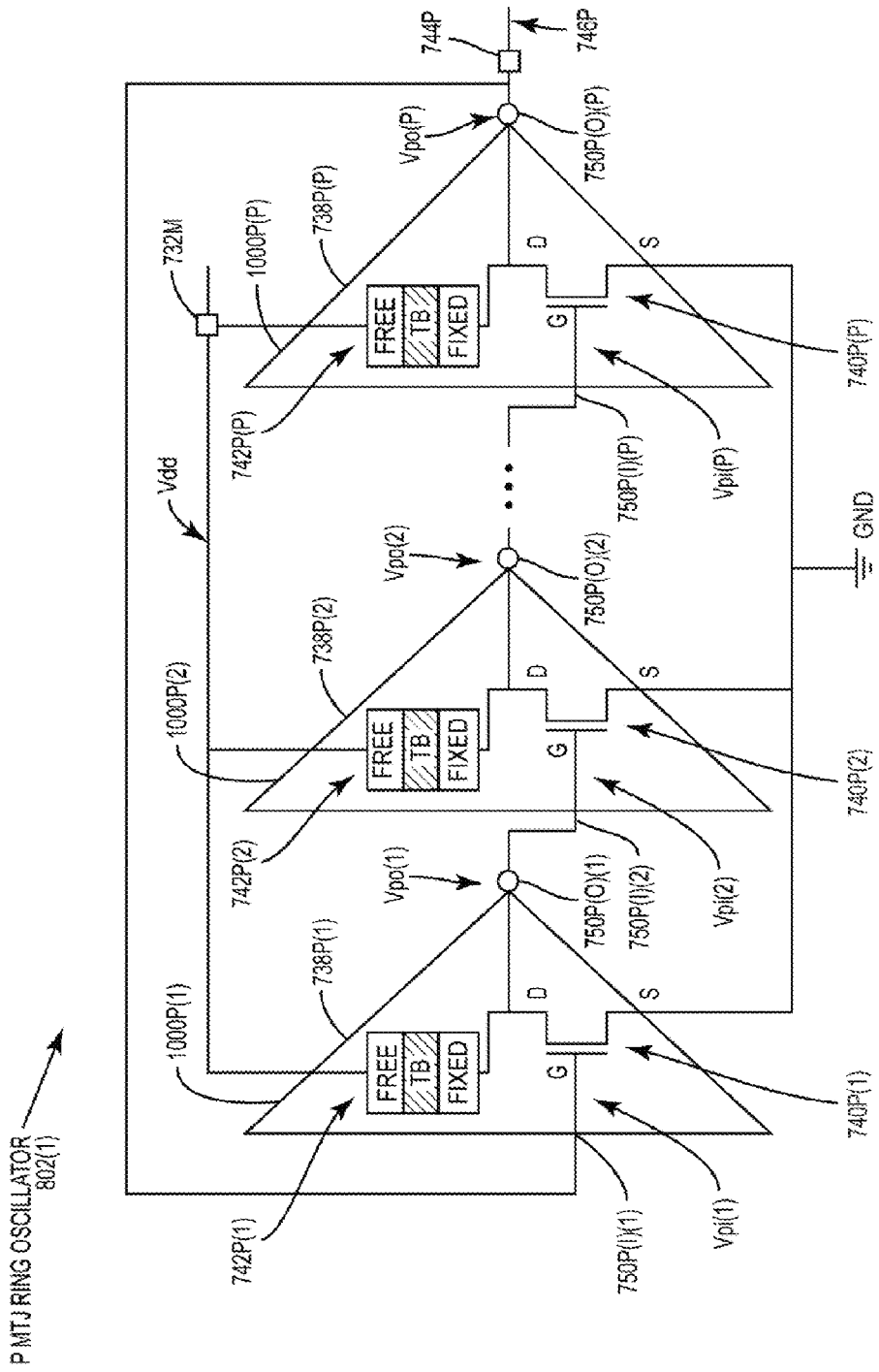
FIG. 10A is a schematic diagram of an exemplary MTJ ring oscillator circuit that can be included in the MTJ PVMC in FIG. 8 and which includes an odd plurality of series connected MRAM circuits each comprising a measurement transistor coupled to an MTJ device with a free layer of the MTJ device coupled to a supply voltage, and a pinned layer of the MTJ device coupled to a drain of the measurement transistor to generate a process variation measurement voltage signal indicating an MTJ process variation in an MRAM bit cell in a parallel (P) magnetization state.
Figure 10B:
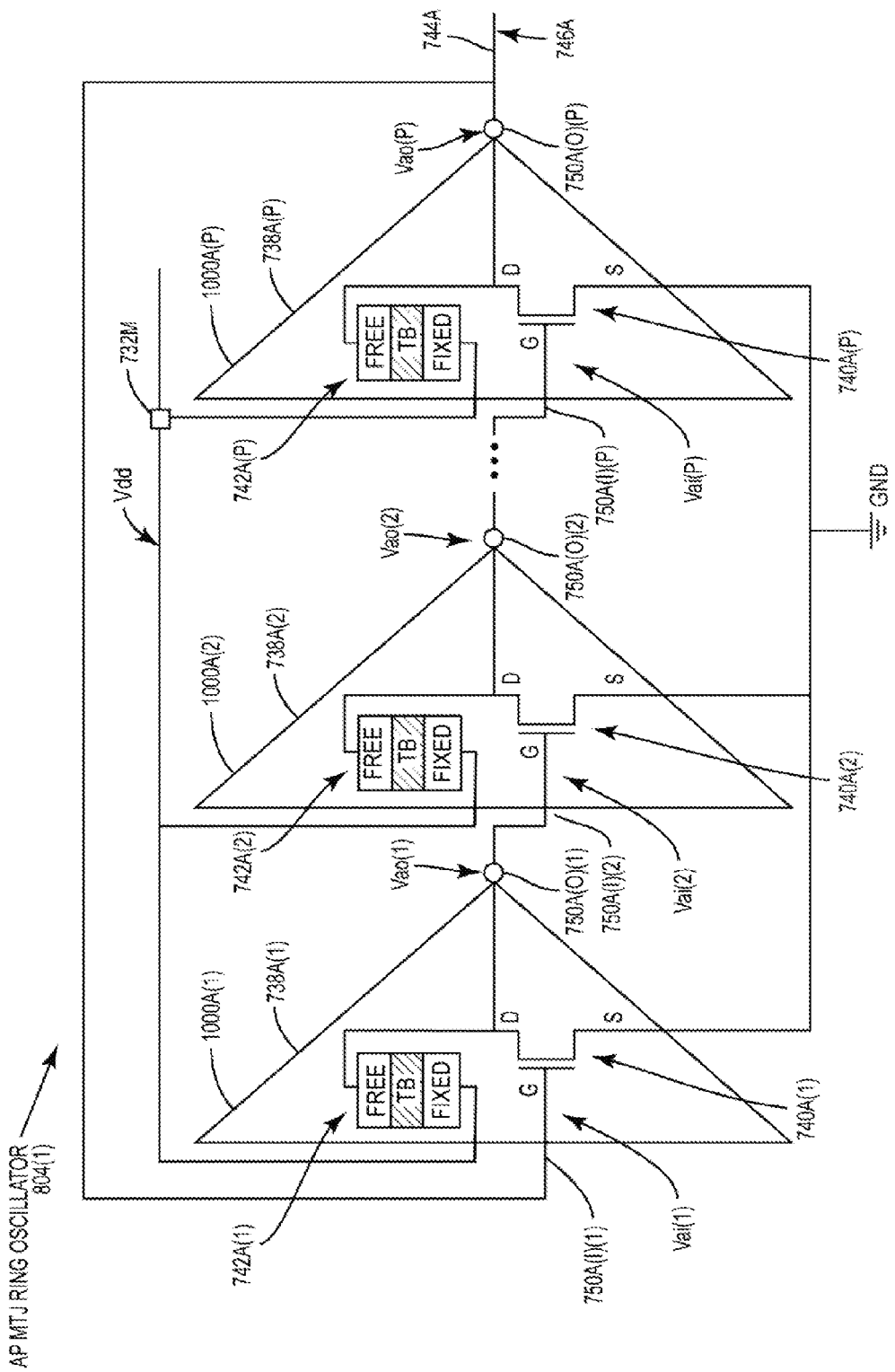
FIG. 10B is a schematic diagram of an exemplary MTJ ring oscillator circuit that can be included in the MTJ PVMC in FIG. 8 and which includes an odd plurality of series connected MRAM circuits each comprising a measurement transistor coupled to an MTJ device with a pinned layer of the MTJ device coupled to a supply voltage, and a free layer of the MTJ device coupled to a drain of the measurement transistor to generate a process variation measurement voltage signal indicating an MTJ process variation in an MRAM bit cell in an anti-parallel (AP) magnetization state.
Figure 10C:
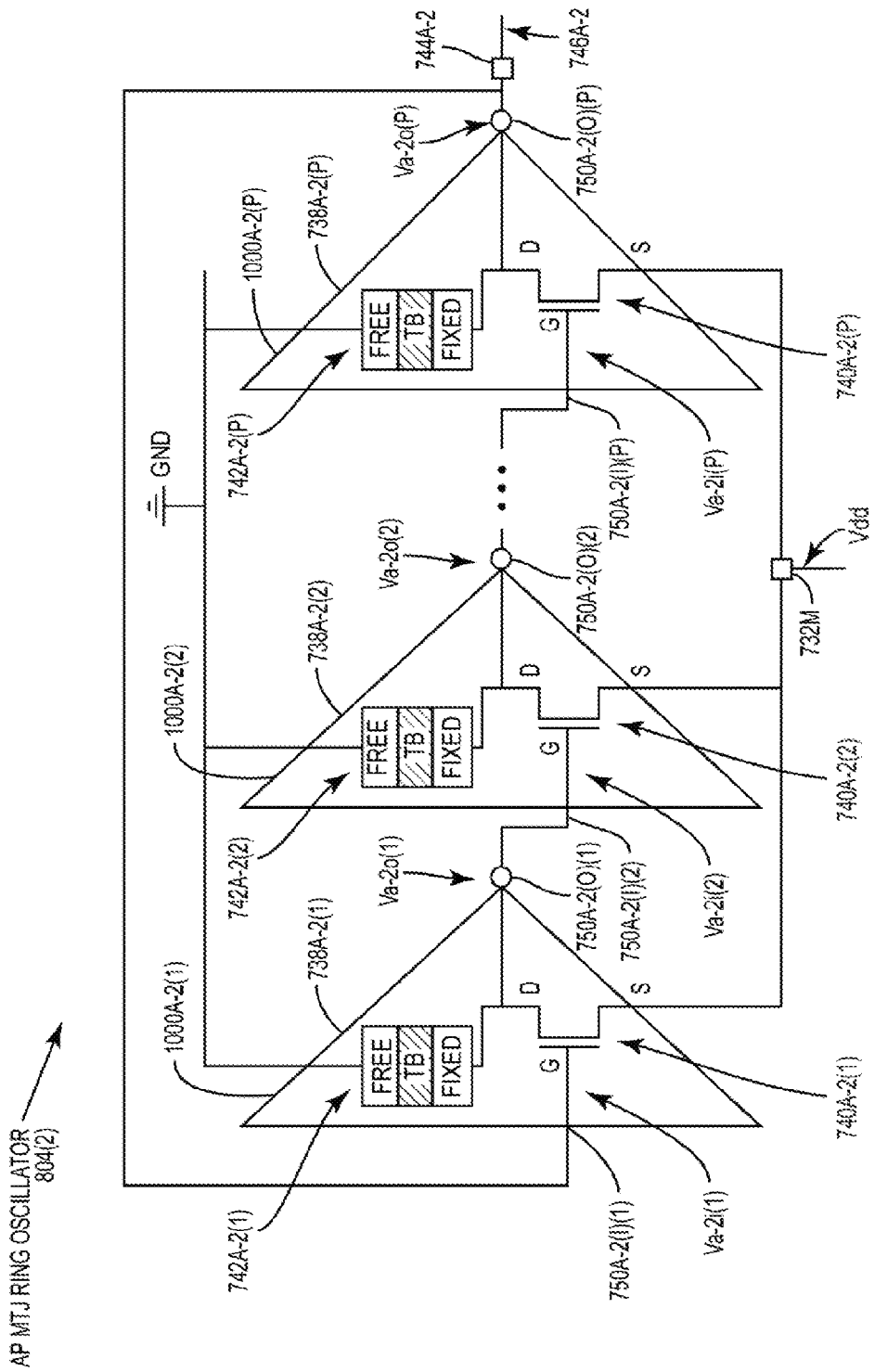
FIG. 10C is a schematic diagram of another exemplary MTJ ring oscillator circuit that can be included in the MTJ PVMC in FIG. 8 and which includes an odd plurality of series connected MRAM circuits each comprising a measurement transistor coupled to an MTJ device with a free layer of the MTJ device coupled to a ground node, and a pinned layer of the MTJ device coupled to a drain of the measurement transistor to generate a process variation measurement voltage signal indicating an MTJ process variation in an MRAM bit cell in an AP magnetization state.

FIGS. 10A-10C illustrate examples of MTJ ring oscillators 802(1), 804(1)-804(2) that can be provided as the MTJ ring oscillators 802, 804 in the MTJ PVMC 736 in FIG. 8. In this regard, FIG. 10A is a schematic diagram of an exemplary P MTJ ring oscillator 802(1) that can be employed as the P MTJ ring oscillator 802(1) in the MTJ PVMC 736 in FIG. 8. As discussed below, the P MTJ ring oscillator 802(1) is configured to generate the process variation measurement voltage signal 746P as a function of process variation in the MRAM bit cells 406(0)(0)-406(M)(N) that are in the P magnetization state. Process variations in the MRAM bit cells 406(0)(0)-406(M)(N) in a P magnetization state may exhibit different performance characteristics than when the MRAM bit cells 406(0)(0)-406(M)(N) are in an AP magnetization state. As discussed above, the power management circuit 434 in FIG. 7 is configured to receive both process variation measurement voltage signals 746P, 746A to provide information about process variations for both the P and AP magnetization states to dynamically adjust the supply voltage Vdd for write operations based on the magnetization state to be written to the MRAM bit cells 406(0)(0)-406(M)(N) in a write operation.

With reference to FIG. 10A, the P MTJ ring oscillator 802(1) includes an odd number of at least three (3) of the MTJ circuits 738P(1)-738P(P) each comprising a respective inverting logic circuits 1000P(1)-1000P(P) connected in series with each other. An odd number of the inverting logic circuits 1000P(1)-1000P(P) are each configured to perform a logic inversion operation so that the process variation measurement voltage signal 746P will alternate between different voltage states as a function of delay of voltage signal propagation through the P MTJ ring oscillator 802(1). Each inverting logic circuit 1000P(1)-1000P(P) has a respective MTJ input node 750P(I)(1)-750P(I)(P) and an MTJ output node 750P(O)(1)-750(O)(P). Each inverting logic circuit 1000P(1)-1000P(P) includes a measurement transistor 740P(1)-740P(P) comprising a gate G, a source S, and a drain D. The sources S of each measurement transistor 740P(1)-740P(P) are coupled to a ground node GND. The measurement transistors 740P(1)-740P(P) may be selected to be a MOS type of the access transistors 414 provided in the MRAM bit cells 406(0)(0)-406(M)(N) in the memory system 700 in FIG. 7 so that the performance (i.e., drive strength) of the measurement transistors 740P(1)-740P(P) represents the performance and thus the process variation in the access transistors 414.

With continuing reference to FIG. 10A, each inverting logic circuit 1000P(1)-1000P(P) also includes a measurement MTJ device 742P(1)-742P(P) that includes a pinned layer FIXED, a free layer FREE, and a tunnel barrier TB disposed between the pinned layer FIXED and the free layer FREE. The measurement MTJ devices 742P(1)-742P(P) may be fabricated according to the same specifications as the MTJ devices 412 in the MRAM bit cells 406(0)(0)-406(M)(N) in the memory system 700 in FIG. 7 so that the resistance of the measurement MTJ device 742P(1)-742P(P) represents the resistance and thus the process variation in the MTJ devices 412. The free layers FREE of the measurement MTJ devices 742P(1)-742P(P) are coupled to the supply voltage input 732M (see also FIG. 7) to keep the measurement MTJ devices 742P(1)-742P(P) in a P magnetization state. The drains D of the measurement transistors 740P(1)-740P(P) are each coupled to the pinned layers FIXED of the respective measurement MTJ devices 742P(1)-742P(P) and the gates G of the measurement transistors 740P(1)-740P(P) in a succeeding inverting logic circuit 1000P(1)-1000P(P). The MTJ measurement output 744P is coupled to the gate G of the measurement transistor 740P(1) in the first inverting logic circuit 1000P(1).

The supply voltage Vdd being applied to the supply voltage input 732M causes a switching current to pass through the measurement MTJ devices 742P(1)-742P(P) and to the drain D of the measurement transistors 740P(1)-740P(P) to provide respective MTJ output voltages Vpo(1)-Vpo(P) on MTJ output nodes 750P(O)(1)-750P(O)(P). The MTJ output voltages Vpo(1)-Vpo(P) are provided as MTJ inputs voltages Vpi(2)-Vpi(P), Vpi(1) to MTJ input nodes 750P(I)(1)-750P(I)(P) of respective succeeding MTJ devices 742P(2)-742P(P), 742P(1). Thus, every odd measurement transistor 740P(1)-740(P) will be turned on by the MTJ output voltage Vpo(1)-Vpo(P) at their respective gate G with the other measurement transistors 740P(1)-740(P) turned off by the MTJ output voltage Vpo(1)-Vpo(P) at their respective gate G at a given time, switching back and forth between on and off states. Thus, the last MTJ voltage output Vpo(P) that provides the process variation measurement voltage signal 746P will alternate states as a function of the performance affected by process variation of the inverting logic circuits 1000P(1)-1000P(P).

FIG. 10B is a schematic diagram of an exemplary AP MTJ ring oscillator 804(1) that can be employed as the AP MTJ ring oscillator 804 in the MTJ PVMC 736 in FIG. 8. As discussed below, the AP MTJ ring oscillator 804(1) is configured to generate the process variation measurement voltage signal 746A as a function of process variation in the MRAM bit cells 406(0)(0)-406(M)(N) that are in the AP magnetization state. Process variations in the MRAM bit cells 406(0)(0)-406(M)(N) in an AP magnetization state may exhibit different performance characteristics than when the MRAM bit cells 406(0)(0)-406(M)(N) are in a P magnetization state. As discussed above, the power management circuit 434 in FIG. 7 is configured to receive both process variation measurement voltage signals 746P, 746A to provide information about process variations for both the P and AP magnetization states to dynamically adjust the supply voltage Vdd for write operations based on the magnetization state to be written to the MRAM bit cells 406(0)(0)-406(M)(N) in a write operation.

With reference to FIG. 10B, the AP MTJ ring oscillator 804(1) includes an odd number of at least three (3) of the MTJ circuits 738A(1)-738A(P) each comprising a respective inverting logic circuits 1000A(1)-1000A(P) connected in series with each other. An odd number of the inverting logic circuits 1000A(1)-1000A(P) are each configured to perform a logic inversion operation so that the process variation measurement voltage signal 746A will alternate between different voltage states as a function of delay of voltage signal propagation through the AP MTJ ring oscillator 804(1). Each inverting logic circuit 1000A(1)-1000A(P) has a respective MTJ input node 750A(I)(1)-750A(I)(P) and an MTJ output node 750A(O)(1)-750A(O)(P). Each inverting logic circuit 1000A(1)-1000A(P) includes a measurement transistor 740A(1)-740A(P) comprising a gate G, a source S, and a drain D. The sources S of each measurement transistor 740A(1)-740A(P) are coupled to a ground node GND. The measurement transistors 740A(1)-740A(P) may be selected to be a MOS type of the access transistors 414 provided in the MRAM bit cells 406(0)(0)-406(M)(N) in the memory system 700 in FIG. 7 so that the performance (i.e., drive strength) of the measurement transistors 740A(1)-740A(P) represents the performance, and thus the process variation, in the access transistors 414.

With continuing reference to FIG. 10B, each inverting logic circuit 1000A(1)-1000A(P) also includes a measurement MTJ device 742A(1)-742A(P) that includes a pinned layer FIXED, a free layer FREE, and a tunnel barrier TB disposed between the pinned layer FIXED and the free layer FREE. The measurement MTJ devices 742A(1)-742A(P) may be fabricated according to the same specifications as the MTJ devices 412 in the MRAM bit cells 406(0)(0)-406(M)(N) in the memory system 700 in FIG. 7 so that the resistance of the measurement MTJ devices 742A(1)-742A(P) represents the resistance, and thus the process variation, in the MTJ devices 412. The pinned layer FIXED of the measurement MTJ devices 742A(1)-742A(P) are coupled to the supply voltage input 732M (see also FIG. 7) to keep the measurement MTJ devices 742A(1)-742A(P) in an AP magnetization state. The drains D of the measurement transistors 740A(1)-740A(P) are each coupled to the free layer FREE of the respective measurement MTJ devices 742A(1)-742A(P) and the gates G of the measurement transistors 740A(1)-740A(P) in a succeeding inverting logic circuit 1000A(1)-1000A(P). The MTJ measurement output 744A is coupled to the gate G of the measurement transistor 740A(1) in the first inverting logic circuit 1000A(1).

The supply voltage Vdd being applied to the supply voltage input 732M causes a switching current to pass through the measurement MTJ devices 742A(1)-742A(P) and to the drains D of the measurement transistors 740A(1)-740A(P) to provide respective MTJ output voltages Vao(1)-Vao(P) on MTJ output nodes 750A(O)(1)-750A(O)(P). The MTJ output voltages Vao(1)-Vao(P) are provided as MTJ inputs voltages Vai(2)-Vai(P), Vpi(1) to MTJ input nodes 750A(I)(1)-750A(I)(P) of respective succeeding MTJ devices 742A(2)-742A(P), 742A(1). Thus, every odd measurement transistor 740A(1)-740A(P) will be turned on by the MTJ output voltage Vao(1)-Vao(P) at their respective gate G with the other measurement transistors 740A(1)-740A(P) turned off by the MTJ output voltage Vao(1)-Vao(P) at their respective gate G at a given time, switching back and forth between on and off states. Thus, the last MTJ output voltage Vao(P) that provides the process variation measurement voltage signal 746A will alternate states as a function of the performance affected by process variation of the inverting logic circuits 1000A(1)-1000A(P).

FIG. 10C is a schematic diagram of another exemplary AP MTJ ring oscillator 804(2) that can be employed as the AP MTJ ring oscillator 804 in the MTJ PVMC 736 in FIG. 8. As discussed below, the AP MTJ ring oscillator 804(2) includes the same circuit scheme as provided in the P MTJ ring oscillator 802(1) in FIG. 10A, but the supply voltage Vdd and ground node GND connections are reversed. This circuit scheme provides for the source degeneration body effect of the measurement transistors 740A-2(1)-740A-2(P) in the AP MTJ ring oscillator 804(2) to be present, which increases the threshold voltage of the measurement transistors 740A-2(1)-740A-2(P) and the performance of the measurement transistors 740A-2(1)-740A-2(P). This circuit connection scheme may provide a closer representation of the MRAM bit cells 406(0)(0)-406(M)(N). Thus, the AP MTJ ring oscillator 804(2) is still configured to generate a process variation measurement voltage signal 746A-2 as a function of process variation in the MRAM bit cells 406(0)(0)-406(M)(N) that are in the AP magnetization state.

With reference to FIG. 10C, the AP MTJ ring oscillator 804(2) includes an odd number of at least three (3) of the MTJ circuits 738A-2(1)-738A-2(P) each comprising a respective inverting logic circuit 1000A-2(1)-1000A-2(P) connected in series with each other. An odd number of the inverting logic circuits 1000A-2(1)-1000A-2(P) are each configured to perform a logic inversion operation so that the process variation measurement voltage signal 746A-2 will alternate between different voltage states as a function of delay of voltage signal propagation through the AP MTJ ring oscillator 804(2). Each inverting logic circuit 1000A-2(1)-1000A-2(P) has a respective MTJ input node 750A-2(I)(1)-750A-2(I)(P) and an MTJ output node 750A-2(O)(1)-750A-2(O)(P). Each inverting logic circuit 1000A-2(1)-1000A-2(P) includes a measurement transistor 740A-2(1)-740A-2(P) comprising a gate G, a source S, and a drain D. The sources S of each measurement transistor 740A-2(1)-740A-2(P) are coupled to the supply voltage input 732M. The measurement transistors 740A-2(1)-740A-2(P) may be selected to be a MOS type of the access transistors 414 provided in the MRAM bit cells 406(0)(0)-406(M)(N) in the memory system 700 in FIG. 7 so that the performance (i.e., drive strength) of the measurement transistors 740A-2(1)-740A-2(P) represents the performance, and thus the process variation, in the access transistors 414.

With continuing reference to FIG. 10C, each inverting logic circuit 1000A-2(1)-1000A-2(P) also includes a measurement MTJ device 742A-2(1)-742A-2(P) that includes a pinned layer FIXED, a free layer FREE, and a tunnel barrier TB disposed between the pinned layer FIXED and the free layer FREE. The measurement MTJ device 742A-2(1)-742A-2(P) may be fabricated according to the same specifications as the MTJ devices 412 in the MRAM bit cells 406(0)(0)-406(M)(N) in the memory system 700 in FIG. 7, so that the resistance of the measurement MTJ devices 742A-2(1)-742A-2(P) represents the resistance and thus the process variation in the MTJ devices 412. The free layer FREE of the measurement MTJ devices 742A-2(1)-742A-2(P) are coupled to the ground node GND (see also FIG. 7) to keep the measurement MTJ devices 742A-2(1)-742A-2(P) in an AP magnetization state. The drain D of the measurement transistors 740A-2(1)-740A-2(P) are each coupled to the pinned layer FIXED of the respective measurement MTJ device 742A-2(1)-742A-2(P) and the gate G of the measurement transistors 740A-2(1)-740A-2(P) in a succeeding inverting logic circuit 1000A-2(1)-1000A-2(P). The MTJ measurement output 744A-2 is coupled to the gate G of the measurement transistor 740A-2(1) in the first inverting logic circuit 1000A-2(1).

The supply voltage Vdd being applied to the supply voltage input 732M causes a switching current to pass through the measurement MTJ devices 742A-2(1)-742A-2(P) and to the drain D of the measurement transistors 740A-2(1)-740A-2(P) to provide respective MTJ output voltages Va-2o(1)-Va-2o(P) on MTJ output nodes 750A-2(O)(1)-750A-2(O)(P). The MTJ output voltages Va-2o(1)-Va-2o(P) are provided as MTJ inputs voltages Va-2i(2)-Va-2i(P), Va-2i(1) to MTJ input nodes 750A-2(I)(1)-750A-2(I)(P) of respective succeeding MTJ devices 742A-2(2)-742A-2(P), 742A-2(1). Thus, every odd measurement transistor 740A-2(1)-740A-2(P) will be turned on by the MTJ output voltage Va-2o(1)-Va-2o(P) at their respective gate G with the other measurement transistors 740A-2(1)-740A-2(P) turned off by the MTJ output voltage Va-2o(1)-Va-2o(P) at their respective gate G at a given time, switching back and forth between on and off states. Thus, the last MTJ voltage output Va-2o(P) that provides the process variation measurement voltage signal 746A-2 will alternate states as a function of the performance affected by process variation of the inverting logic circuits 1000A-2(1)-1000A-2(P).

Figure 11:
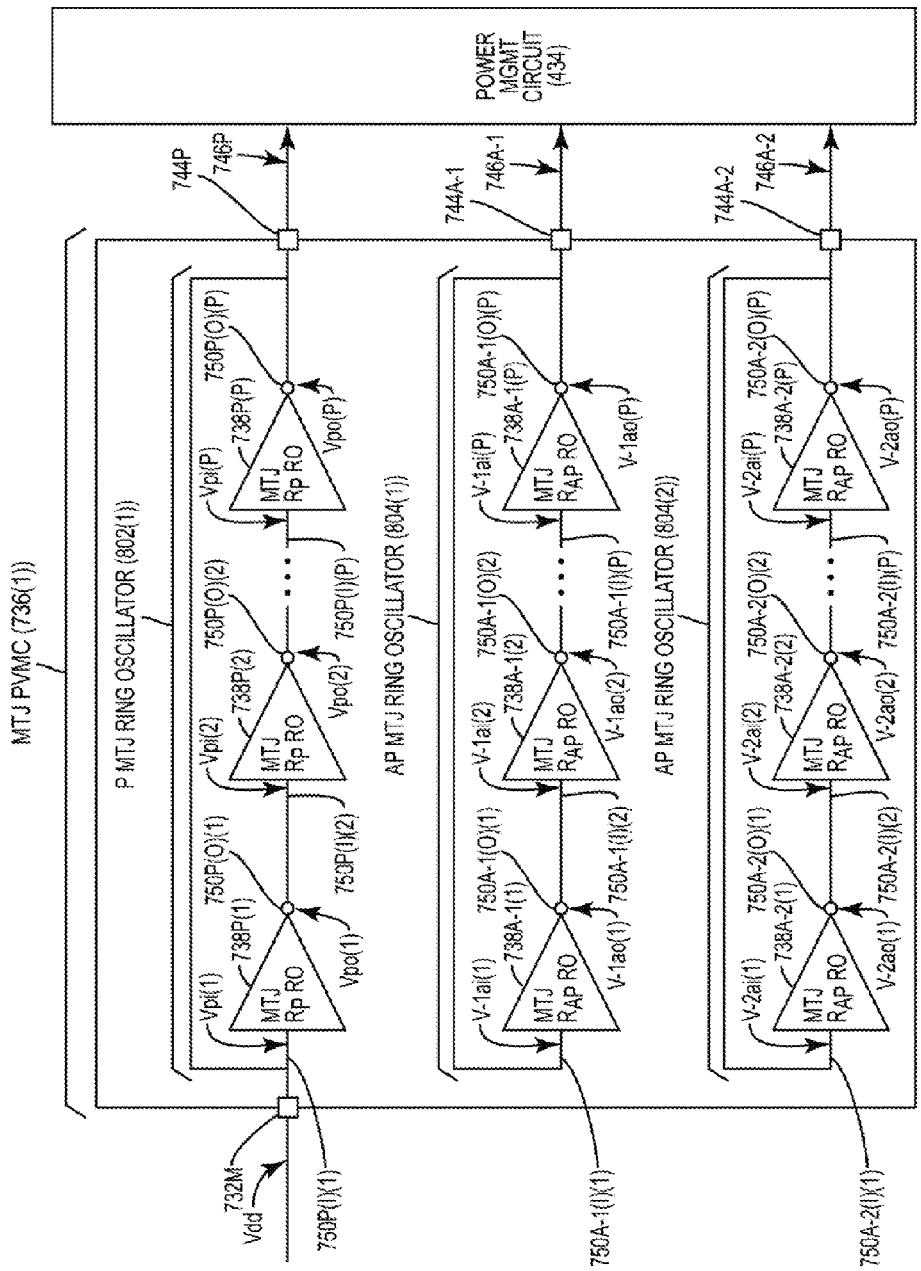
FIG. 11 is a schematic diagram of alternative exemplary MTJ ring oscillators that can be employed as MTJ ring oscillator circuits in the MTJ PVMC in FIG. 7 to measure MTJ process variations for P and AP magnetization states.

It may be desired to include both of the AP MTJ ring oscillators 804(1), 804(2) in FIGS. 10B and 10C in the MTJ PVMC 736 in the MRAM bit cell PVMC 702 in FIG. 7 for example, so that the performance of the AP MTJ ring oscillators 804(1), 804(2) can be combined or averaged to be used to determine process variation in the MRAM bit cells 406(0)(0)-406(M)(N). In this regard, FIG. 11 is a schematic diagram of the MTJ ring oscillators 802(1), 804(1), 804(2) in FIGS. 10A-10C that can be provided in an MTJ PVMC 736(1) that can be provided as the MTJ PVMC 736 in FIG. 7, for example, to measure MTJ process variations in the MRAM bit cells 406(0)(0)-406(M)(N) for P and AP magnetization states. In this regard, the delay performance of the MTJ ring oscillators 802(1), 804(1), 804(2) as indicated by the process variation measurement voltage signals 746P, 746A-1, 746A-2 along with the delay performance as indicated by the logic process variation measurement voltage signal 746L can be used by the power management circuit 434 to determine the process variation in the MRAM bit cells 406(0)(0)-406(M)(N) to dynamically adjust the supply voltage Vdd for access operations. For example, the power management circuit 434 may be equipped with equations whose coefficients can be solved and stored in memory 448 in the power management circuit 434 as shown in FIGS. 4 and 7, to be used to calculate the supply voltage Vdd for access operations.

In this regard, the delay performance $\tau_{wl\_n}$ of the logic ring oscillator 800 in FIG. 7 is proportional to the parasitic capacitance C of the logic circuits 738L, the supply voltage $V_{dd}$ provided to the logic circuits 738L(1)-738(L)(P), and the drive current $I_n$ of the logic circuits 738L(1)-738(L)(P), as shown below in Equation 1:

$$\text{Logic } RO: \tau_{wi\_n} \propto \frac{CV_{dd}}{I_n} \qquad \text{Eq. (1)}$$

The delay performance $\tau_{mtj\_p}$ of the P MTJ ring oscillator 802(1) in FIG. 10A is proportional to the parasitic capacitance C of the measurement transistor 740P, the supply voltage $V_{dd}$ provided to the MTJ circuits 738P(1)-738P(P), and the effective drive current $I_{eff}$ of the MTJ circuits 738P(1)-738P(P), plus the delay performance $\tau_p$ as a result of the measurement MTJ device 742P resistance as shown below in Equation 2:

$$MTJ\ Rp\ RO\ P: \tau_{mtj\_p} \propto \frac{CV_{dd}}{I_{eff}} + \tau_p \approx \tau_{wi\_n} + \tau_p \qquad \text{Eq. (2)}$$

Thus, the delay performance $\tau_p$ solely as a result of the measurement MTJ device 742P resistance in the P magnetization state can be extracted by subtracting the determined delay performance $\tau_{wl\_n}$ of the logic ring oscillator 800 from the delay performance $\tau_{mtj\_p}$ of the P MTJ ring oscillator 802(1), as shown below in Equation 3:

$$\text{Extract } Rp \text{ Variation: } \tau_p = \tau_{mtj\_p} - \tau_{wl\_n} \qquad \text{Eq. (3)}$$

Similarly, the delay performance $\tau_{mtj\_ap}$ of the AP MTJ ring oscillator 804(1) in FIG. 10B is proportional to the parasitic capacitance C of the measurement transistor 740A, the supply voltage $V_{dd}$ provided to the MTJ circuits 738A(1)-738A(P), and the effective drive current $I_{eff}$ of the MTJ circuits 738A(1)-738A(P), plus the delay performance $\tau_{ap}$ as a result of the measurement MTJ device 742A resistance as shown below in Equation 4:

$$MTJ\ Rap\ RO\ A: \tau_{mtj\_ap} \propto \frac{CV_{dd}}{I_{eff}} + \tau_{ap} \approx \tau_{wi\_n} + \tau_{ap} \qquad \text{Eq. (4)}$$

Thus, the delay performance $\tau_{ap}$ solely as a result of the measurement MTJ device 742A resistance in the AP magnetization state can be extracted by subtracting the determined delay performance $\tau_{wl\_n}$ of the logic ring oscillator 800 from the delay performance $\tau_{mtj\_ap}$ of the AP MTJ ring oscillator 804(1), as shown below in Equation 5:

$$\text{Extract } Rap \text{ Variation: } \tau_{ap} = \tau_{mtj\_ap} - \tau_{wl\_n} \qquad \text{Eq. (5)}$$

Similarly, the delay performance $\tau_{mtj\_ap}$ of the AP MTJ ring oscillator 804(2) in FIG. 10C is proportional to the parasitic capacitance C of the measurement transistor 740A-2, the supply voltage $V_{dd}$ provided to the MTJ circuits 738A-2(1)-738A-2(P), and the effective drive current $I_{eff}$ of the MTJ circuits 738A-2(1)-738A-2(P), plus the delay performance $\tau_{ap}$ as a result of the measurement MTJ device 742A-2 resistance as shown below in Equation 6:

$$MTJ\ Rap\ RO\ A-2: \tau_{mtj\_ap\_b} \propto \frac{CV_{dd}}{I_{eff}} + \tau_p \approx \tau_{wi\_b} + \tau_{ap} \qquad \text{Eq. (6)}$$

Thus, the delay performance $\tau_{ap}$ taking into consideration the body effect of MTJ circuits 738A-2(1)-738A-2(P) solely as a result of the measurement MTJ device 742A-2 resistance in the AP magnetization state can be extracted as shown below in Equation 7:

$$\text{Extract WL w/body effect Variation: } \tau_{wl\_b} = \tau_{mtj\_ap\_b} - \tau_{ap} \qquad \text{Eq. (7)}$$

Thus, with the process corners, the measurement MTJ devices 742 and/or and measurement transistors 740 in the MTJ circuits 738, and with optional temperate sensor information, the coefficients a(T), b(T), c(T), d(T) shown below can be determined by the power management circuit 434 and stored in memory 448 for different write operation scenarios to determine the dynamic supply voltage Vdd ($V_{dyn\_p}$, $V_{dyn\_ap}$) for both P and AP magnetization state write operations as shown below in Equations 8 and 9. The dynamic supply voltage Vdd determined and generated by the power management circuit 434 can compensate for both individual logic and MTJ process variations against a typical process corner in the MRAM bit cells 406(0)(0)-406(M)(N)

$$V_{dyn\_p} = a(T) * \tau_{wl\_n} + b(T) * \tau_p \qquad \text{Eq. (8)}$$

$$V_{dyn\_ap} = c(T) * \tau_{wl\_b} + d(T) * \tau_{ap} \qquad \text{Eq. (9)}$$

Figure 12:
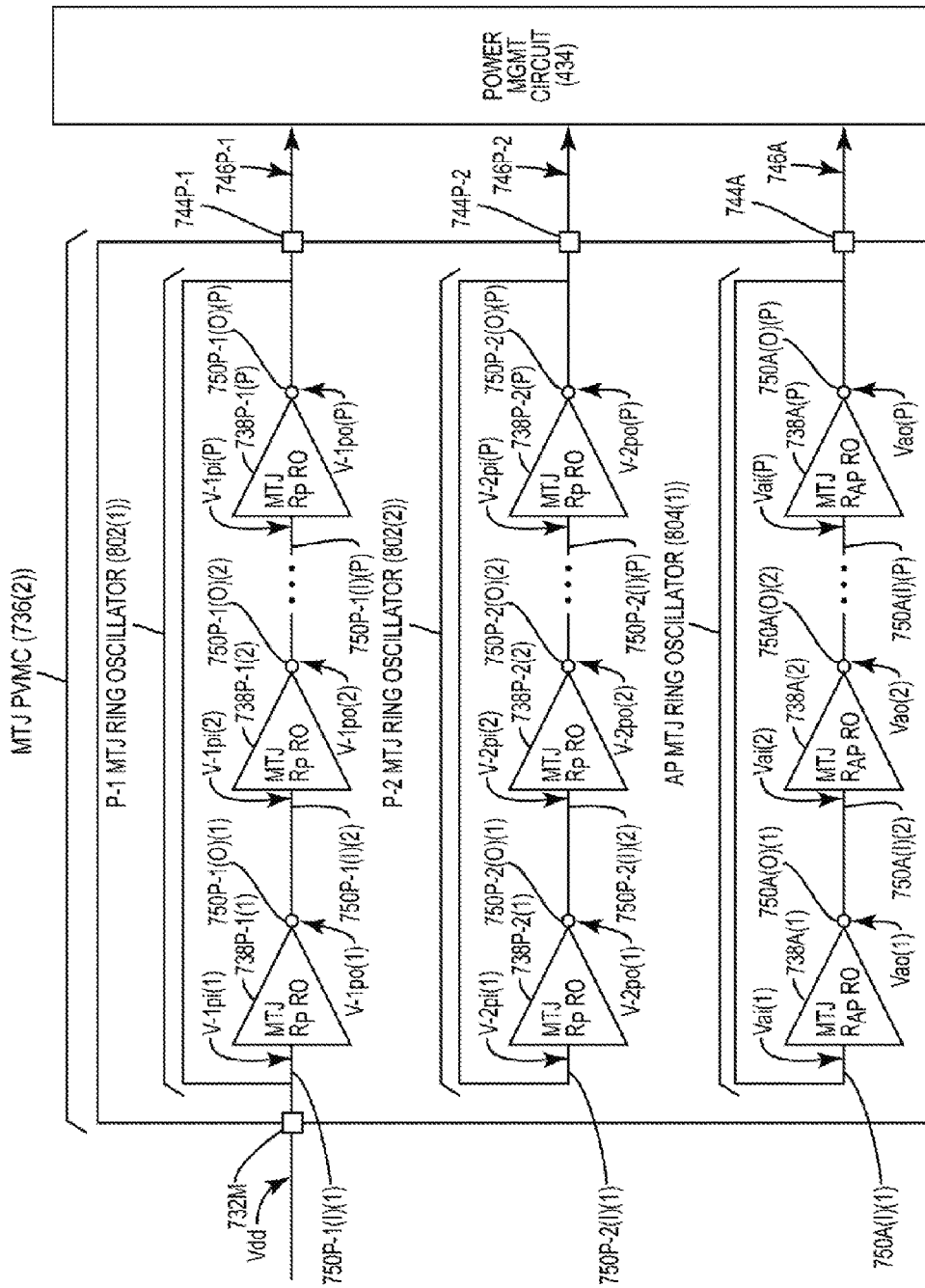
FIG. 12 is a schematic diagram of alternative exemplary MTJ ring oscillators that can be employed as MTJ ring oscillator circuits in the MRAM bit cell PVMC in FIG. 7 to measure MTJ process variations for P and AP magnetization states.
Figure 13A:
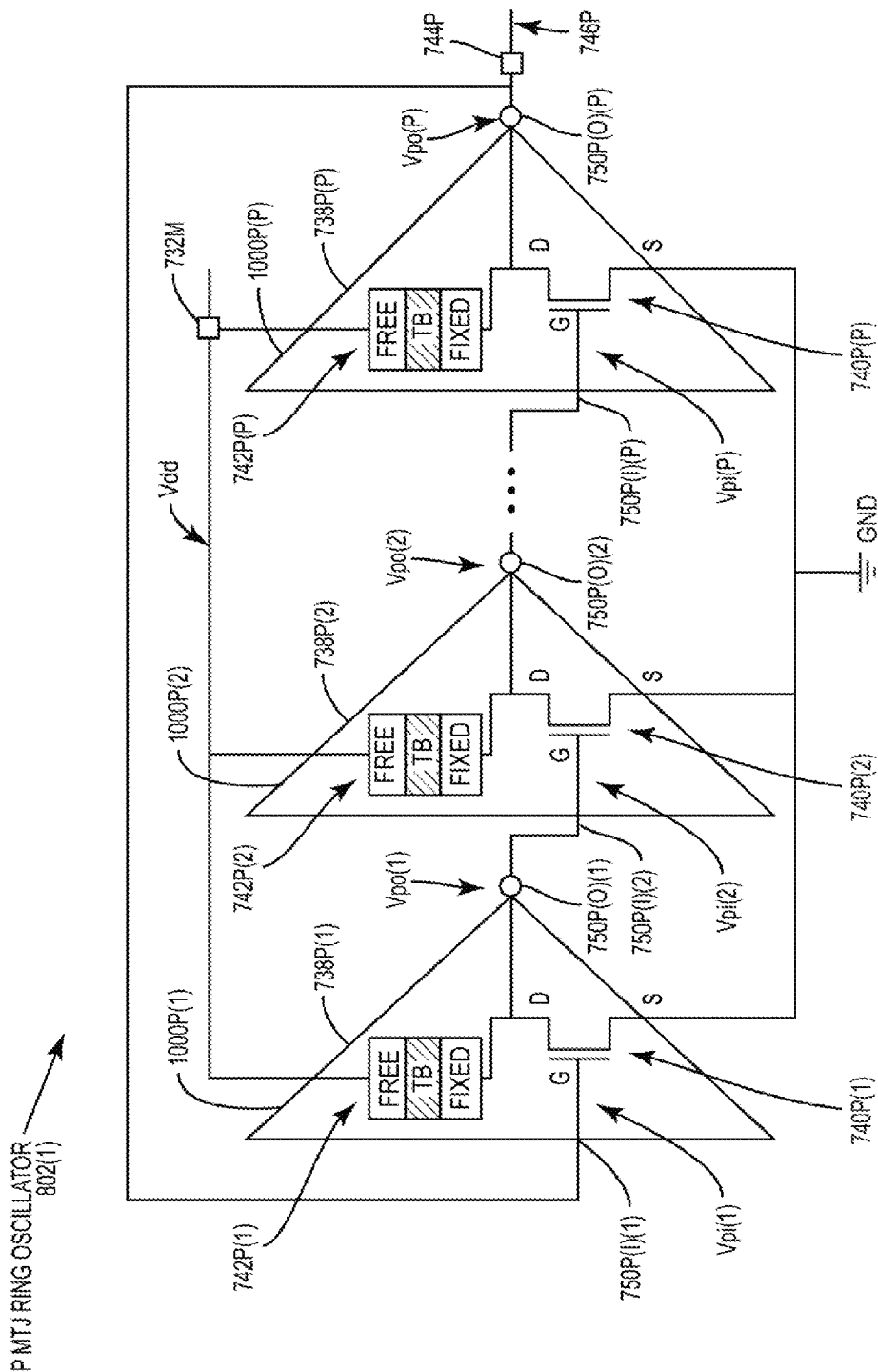
FIG. 13A is a schematic diagram of the exemplary MTJ ring oscillator circuit in FIG. 10A.
Figure 13B:
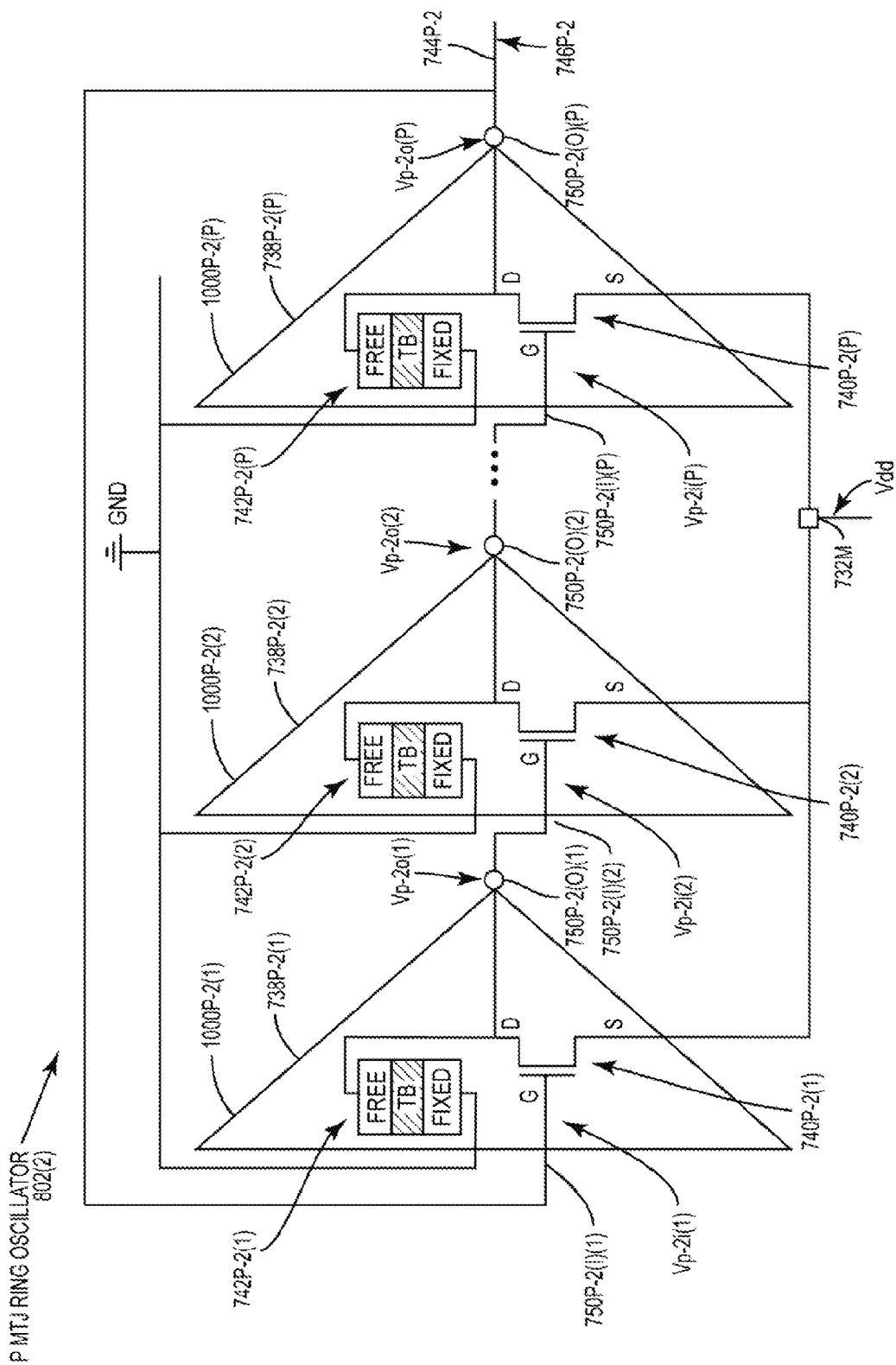
FIG. 13B is a schematic diagram of another exemplary MTJ ring oscillator circuit that includes an odd plurality of series connected MRAM circuits each comprising a measurement transistor coupled to an MTJ device with a pinned layer of the MTJ device coupled to a ground node, and a free layer of the MTJ device coupled to a drain of the measurement transistor to generate a process variation measurement voltage signal indicating an MTJ process variation in an MRAM bit cell in a P magnetization state.
Figure 13C:
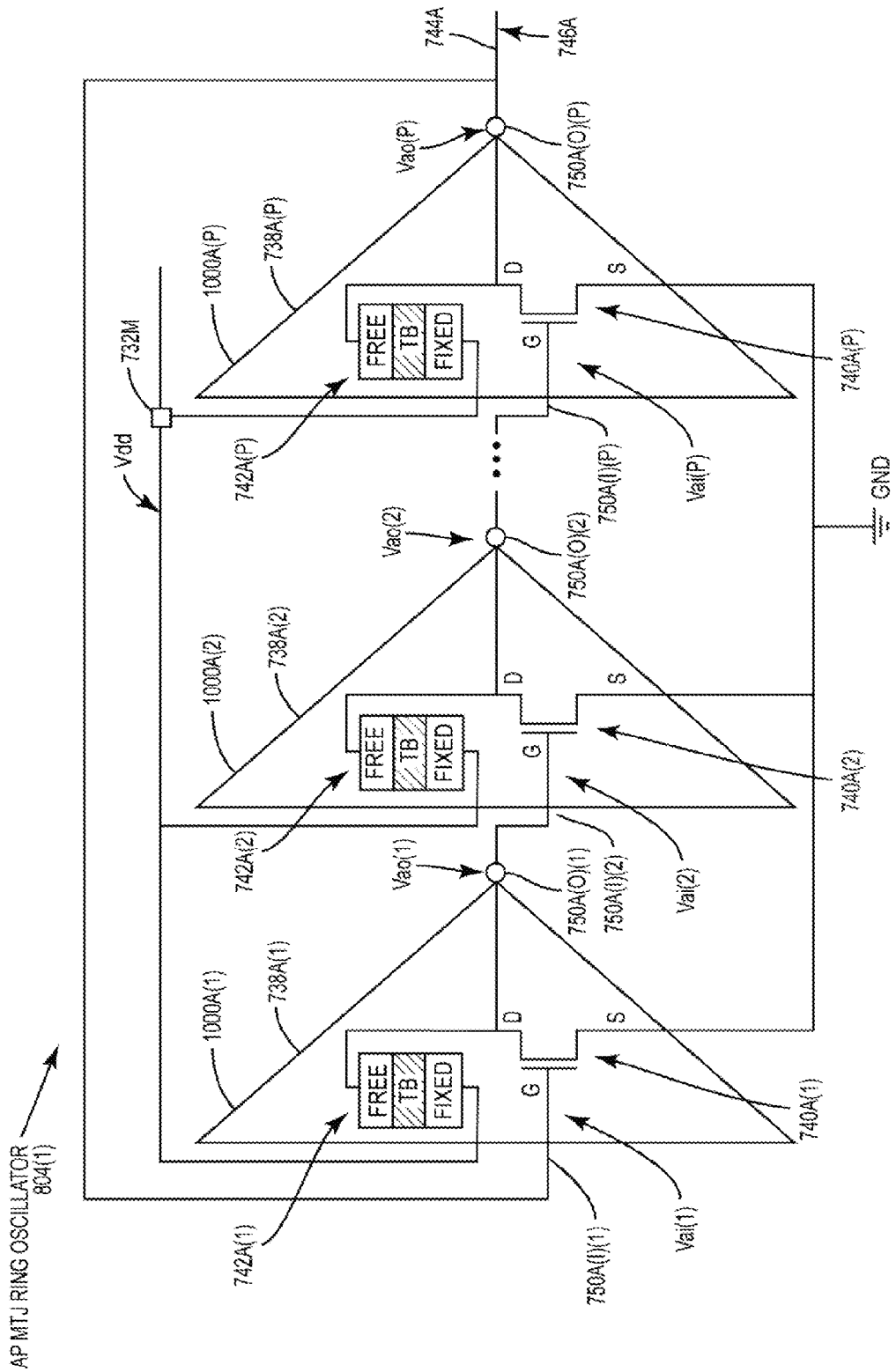
FIG. 13C is a schematic diagram of another exemplary MTJ ring oscillator circuit that includes an odd plurality of series connected MRAM circuits each comprising a measurement transistor coupled to an MTJ device with a pinned layer of the MTJ device coupled to a supply voltage, and a free layer of the MTJ device coupled to a drain of the measurement transistor to generate a process variation measurement voltage signal indicating an MTJ process variation in an MRAM bit cell in an AP magnetization state.

FIG. 12 illustrates examples of MTJ ring oscillators 802(1)-802(2), 804(1) in an alternative MTJ PVMC 736(2) that can be employed as the MTJ PVMC 736 in FIG. 8. FIGS. 13A-13C illustrate the MTJ ring oscillators 802(1)-802(2), 804(1) in more detail. FIG. 13A is the schematic diagram of the P MTJ ring oscillator 802(1) in FIG. 10A and thus will not be re-described. FIG. 13C is the schematic diagram of the AP MTJ ring oscillator 804(1) in FIG. 10B and thus will not be re-described.

FIG. 13B is a schematic diagram of another exemplary P MTJ ring oscillator 802(2) that can be employed as a P MTJ ring oscillator 802 in the MTJ PVMC 736 in FIG. 8. As discussed below, the P MTJ ring oscillator 802(2) is configured to generate the process variation measurement voltage signal 744-2P as a function of process variation in the MRAM bit cells 406(0)(0)-406(M)(N) that are in the P magnetization state. This circuit scheme provides for the source degeneration body effect of the measurement transistors 740P-2(1)-740P-2(P) in the P MTJ ring oscillator 802(2) to be present, which increases the threshold voltage of the measurement transistors 740P-2(1)-740P-2(P) and the performance of the measurement transistors 740P-2(1)-740P-2(P). This circuit connection scheme may provide a closer representation of the MRAM bit cells 406(0)(0)-406(M)(N).

With continuing reference to FIG. 13B, the P MTJ ring oscillator 802(2) includes an odd number of at least three (3) of the MTJ circuits 738P-2(1)-738P-2(P) each comprising a respective inverting logic circuit 1000P-2(1)-1000P-2(P) connected in series with each other. An odd number of the inverting logic circuits 1000P-2(1)-1000P-2(P) is provided so that the process variation measurement voltage signal 746P-2 will alternate between different voltage states as a function of delay of voltage signal propagation through the P MTJ ring oscillator 802(2). Each inverting logic circuit 1000P-2(1)-1000P-2(P) has a respective MTJ input node 750P-2(I)(1)-750P-2(I)(P) and an MTJ output node 750P-2(O)(1)-750P-2(O)(P). Each inverting logic circuit 1000P-2(1)-1000P-2(P) includes a measurement transistor 740P-2(1)-740P-2(P) comprising a gate G, a source S, and a drain D. The sources S of each measurement transistor 740P-2(1)-740P-2(P) are coupled to the supply voltage input 732M. The measurement transistors 740P-2(1)-740P-2(P) may be selected to be a MOS type of the access transistors 414 provided in the MRAM bit cells 406(0)(0)-406(M)(N) in the memory system 700 in FIG. 7 so that the performance (i.e., drive strength) of the measurement transistor 740P-2(1)-740P-2(P) represents the performance and thus the process variation in the access transistors 414.

With continuing reference to FIG. 13B, each inverting logic circuit 1000A(1)-1000P-2(P) also includes a measurement MTJ device 742P-2(1)-742P-2(P) that includes a pinned layer FIXED, a free layer FREE, and a tunnel barrier TB disposed between the pinned layer FIXED and the free layer FREE. The measurement MTJ devices 742P-2(1)-742P-2(P) may be fabricated according to the same specifications as the MTJ devices 412 in the MRAM bit cells 406(0)(0)-406(M)(N) in the memory system 700 in FIG. 7 so that the resistance of the measurement MTJ devices 742P-2(1)-742P-2(P) represents the resistance and thus the process variation in the MTJ devices 412. The pinned layers FIXED of the measurement MTJ devices 742P-2(1)-742P-2(P) are coupled to the ground node GND to keep the measurement MTJ devices 742P-2(1)-742A(P) in a P magnetization state. The drains D of the measurement transistors 740P-2(1)-742P-2(P) are each coupled to the free layer FREE of the respective measurement MTJ device 742P-2(1)-742P-2(P) and the gates G of the measurement transistors 740P-2(1)-742P-2(P) in a succeeding inverting logic circuit 1000P-2(1)-1000P-2(P). The MTJ measurement output 744P-2 is coupled to the gate G of the measurement transistor 740P-2(1) in the first inverting logic circuit 1000P-2(1).

The supply voltage Vdd being applied to the supply voltage input 732M causes a switching current to pass through the measurement MTJ devices 742P-2(1)-742P-2(P) and to the drain D of the measurement transistor 740P-2(1)-740P-2(P) to provide respective MTJ output voltages Vp-2o(1)-Vp-2o(P) on MTJ output nodes 750P-2(O)(1)-750P-2(0)(P). The MTJ output voltages Vp-2o(1)-Vp-2o(P) are provided as MTJ inputs voltages Vp-2i(2)-Vp-2i(P), Vp-2i(1) to MTJ input nodes 750P-2(I)(1)-750P-2(I)(P) of respective succeeding MTJ devices 742P-2(2)-742P-2(P), 742P-2(1). Thus, every odd measurement transistor 740P-2(1)-740P-2(P) will be turned on by the MTJ output voltage Vp-2o(1)-Vp-2o(P) at their respective gate G with the other measurement transistors 740P-2(1)-740P-2(P) turned off by the MTJ output voltage Vp-2o(1)-Vp-2o(P) at their respective gate G at a given time, switching back and forth between on and off states. Thus, the last MTJ voltage output Vp-2o(P) that provides the process variation measurement voltage signal 746P-2 will alternate states as a function of the performance affected by process variation of the inverting logic circuits 1000P-2(1)-1000P-2(P).

It may be desired to include both of the P MTJ ring oscillators 802(1), 802(2) in FIGS. 13A and 13B in the MTJ PVMC 736 in the MRAM bit cell PVMC 702 in FIG. 7 for example, so that the performance of the P MTJ ring oscillators 802(1), 802(2) can be combined or averaged to be used to determine process variation in the MRAM bit cells 406(0)(0)-406(M)(N). FIG. 12 is a schematic diagram that includes the MTJ ring oscillators 802(1), 802(2), 804(1) in FIGS. 13A-13C that can be provided in an MTJ PVMC 736(2) that can be provided as the MTJ PVMC 736 in FIG. 7, for example, to measure MTJ process variations in MRAM bit cells 406(0)(0)-406(M)(N) for P and AP magnetization states. In this regard, the delay performance of the MTJ ring oscillators 802(1), 802(2), 804(2) as indicated by the process variation measurement voltage signals 746P-1, 746P-2, 746A along with the delay performance as indicated by the logic process variation measurement voltage signal 746L can be used by the power management circuit 434 to determine the process variation in the MRAM bit cells 406(0)(0)-406(M)(N) to dynamically adjust the supply voltage Vdd for write operations. For example, the power management circuit 434 may be equipped with equations whose coefficients can be solved and stored in memory 448 in the power management circuit 434 as shown in FIGS. 4 and 7, to be used to calculate the supply voltage Vdd to be generated for write operations.

In this regard, the delay performance $\tau_{wl\_n}$ of the logic ring oscillator 800 in FIG. 7 is proportional to the parasitic capacitance C of the logic circuits 738L(1)-738L(P), the supply voltage $V_{dd}$ provided to the logic circuits 738L(1)-738L(P), and the drive current $I_n$ of the logic circuits 738L(1)-738L(P), as shown below in Equation 10:

$$\text{Logic } RO: \tau_{wi\_n} \propto \frac{CV_{dd}}{I_n} \qquad \text{Eq. (10)}$$

The delay performance $T_{mtj\_p}$ of the P MTJ ring oscillator 802(1) in FIG. 13A is proportional to the parasitic capacitance C of the measurement transistor 740P, the supply voltage $V_{dd}$ provided to the MTJ circuits 738P(1)-738P(P), and the effective drive current $I_{eff}$ of the MTJ circuits 738P(1)-738P(P), plus the delay performance $\tau_p$ as a result of the measurement MTJ device 742P resistance as shown below in Equation 11:

$$MTJ\ Rp\ RO\ P: \tau_{mtj\_p} \propto \frac{CV_{dd}}{I_{eff}} + \tau_p \approx \tau_{wi\_n} + \tau_p \qquad \text{Eq. (11)}$$

Thus, the delay performance $\tau_p$ solely as a result of the measurement MTJ device 742P resistance in the P magnetization state can be extracted by subtracting the determined delay performance $\tau_{wl\_n}$ of the logic ring oscillator 800 from the delay performance $T_{mtj\_p}$ of the P MTJ ring oscillator 802(1), as shown below in Equation 12:

Extract Rp Variation: $\tau_p = \tau_{mtj\_p} - \tau_{wl\_n}$  Eq. (12)

Similarly, the delay performance $T_{mtj\_p}$ of the P MTJ ring oscillator 802(2) in FIG. 13B is proportional to the parasitic capacitance C of the measurement transistor 740P-2, the supply voltage $V_{dd}$ provided to the MTJ circuits 738P-2(1)-738P-2(P), and the effective drive current $I_{\it eff}$ of the MTJ circuits 738P-2(1)-738P-2(P), plus the delay performance $\tau_p$ as a result of the measurement MTJ device 742P-2 resistance as shown below in Equation 13:

$$\text{MTJ } Rp \ RO \ P\text{-}2 : \tau_{mtj\_p\_b} \propto \frac{CV_{dd}}{I_{\it eff}} + \tau_p \approx \tau_{wi\_b} + \tau_p \quad \text{Eq. (13)}$$

Thus, the delay performance $\tau_p$ taking into consideration the body effect of MTJ circuits 738P-2(1)-738P-2(P) solely as a result of the measurement MTJ device 742P-2 resistance in the P magnetization state can be extracted as shown below in Equation 14:

Extract WL w/body effect Variation: $\tau_{wl\_b} = \tau_{mtj\_p\_b} - \tau_p$  Eq. (14)

Similarly, the delay performance $\tau_{mtj\_ap}$ of the AP MTJ ring oscillator 804(1) in FIG. 13C is proportional to the parasitic capacitance C of the measurement transistor 740A, the supply voltage $V_{dd}$ provided to the MTJ circuits 738A(1)-738A(P), and the effective drive current $I_{\it eff}$ of the MTJ circuits 738A(1)-738A(P), plus the delay performance $\tau_{ap}$ as a result of the measurement MTJ device 742A resistance as shown below in Equation 15:

$$\text{MTJ Rap } RO \ A : \tau_{mtj\_ap} \propto \frac{CV_{dd}}{I_{\it eff}} + \tau_{ap} \approx \tau_{wi\_n} + \tau_{ap} \quad \text{Eq. (15)}$$

Thus, the delay performance $\tau_{ap}$ solely as a result of the measurement MTJ device 742A resistance in the AP magnetization state can be extracted by subtracting the determined delay performance $\tau_{wl\_n}$ of the logic ring oscillator 800 from the delay performance $\tau_{mtj\_ap}$ of the AP MTJ ring oscillator 804(1), as shown below in Equation 16:

Extract Rap Variation: $\tau_{ap} = \tau_{mtj\_ap} - \tau_{wl\_n}$  Eq. (16)

Thus, with the process corners, measurement MTJ devices 742 and/or and measurement transistors 740 in the MTJ circuit 738, and with optional temperate sensor information, the coefficients a(T), b(T), c(T), d(T) shown below can be determined by the power management circuit 434 and stored in memory 448 for different write operation scenarios to determine the dynamic supply voltage Vdd ($V_{dyn\_p}$, $V_{dyn\_ap}$) for both P and AP magnetization state write operations as shown below in Equations 17 and 18. The dynamic supply voltage Vdd determined and generated by the power management circuit 434 can compensate for both individual logic and MTJ process variations against a typical process corner in the MRAM bit cells 406(0)(0)-406(M)(N).

$V_{dyn\_p} = a(T)^* \tau_{wl\_b} + b(T)^* \tau_p$  Eq. (17)

$V_{dyn\_ap} = c(T)^* \tau_{wl\_n} + d(T)^* \tau_{ap}$  Eq. (18)

In another aspect, an MRAM bit cell PVMC is provided that comprises a means for coupling a supply voltage coupled to the MRAM array, to a means for measuring MTJ process variation. The means for coupling can include the supply voltage input 432 in FIG. 4, and supply voltage input 732M in FIGS. 7, 8, 10A-10C, and 13A-13C, as non-limiting examples. For example, the means for measuring MTJ process variation can include the MTJ PVMC 436 in FIG. 4, and the MTJ PVMC 736 in FIGS. 7 and 8. The means for measuring MTJ process variation comprises a means for generating an MTJ process variation measurement indicator representing process variation in a measurement transistor and process variation in a measurement MTJ device, representing process variation of an access transistor and an MTJ device in at least one MRAM bit cell in the MRAM array, as a function of the supply voltage. For example, the means for generating an MTJ process variation measurement indicator representing process variation in a measurement transistor and process variation in a measurement MTJ device, can include one or more of the MTJ circuits 438(1)-438(P) in FIG. 4, one or more of the MTJ circuits 738(1)-738(P) in FIG. 7, the P MTJ ring oscillator 802 in FIG. 8, which can be the P MTJ ring oscillator 802(1) in FIGS. 10A and 13A or the P MTJ ring oscillator 802(2) in FIG. 13B, and/or the AP MTJ ring oscillator 804 in FIG. 8, which can be the AP MTJ ring oscillator 804(1) in FIGS. 10B and 13C or the AP MTJ ring oscillator 80(2) in FIG. 10C.

ICs that include process variation measurement circuits to allow for dynamically generating a supply voltage at a desired voltage level for access operations to MRAM bit cells to account for process variations therein, and according to aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 14:
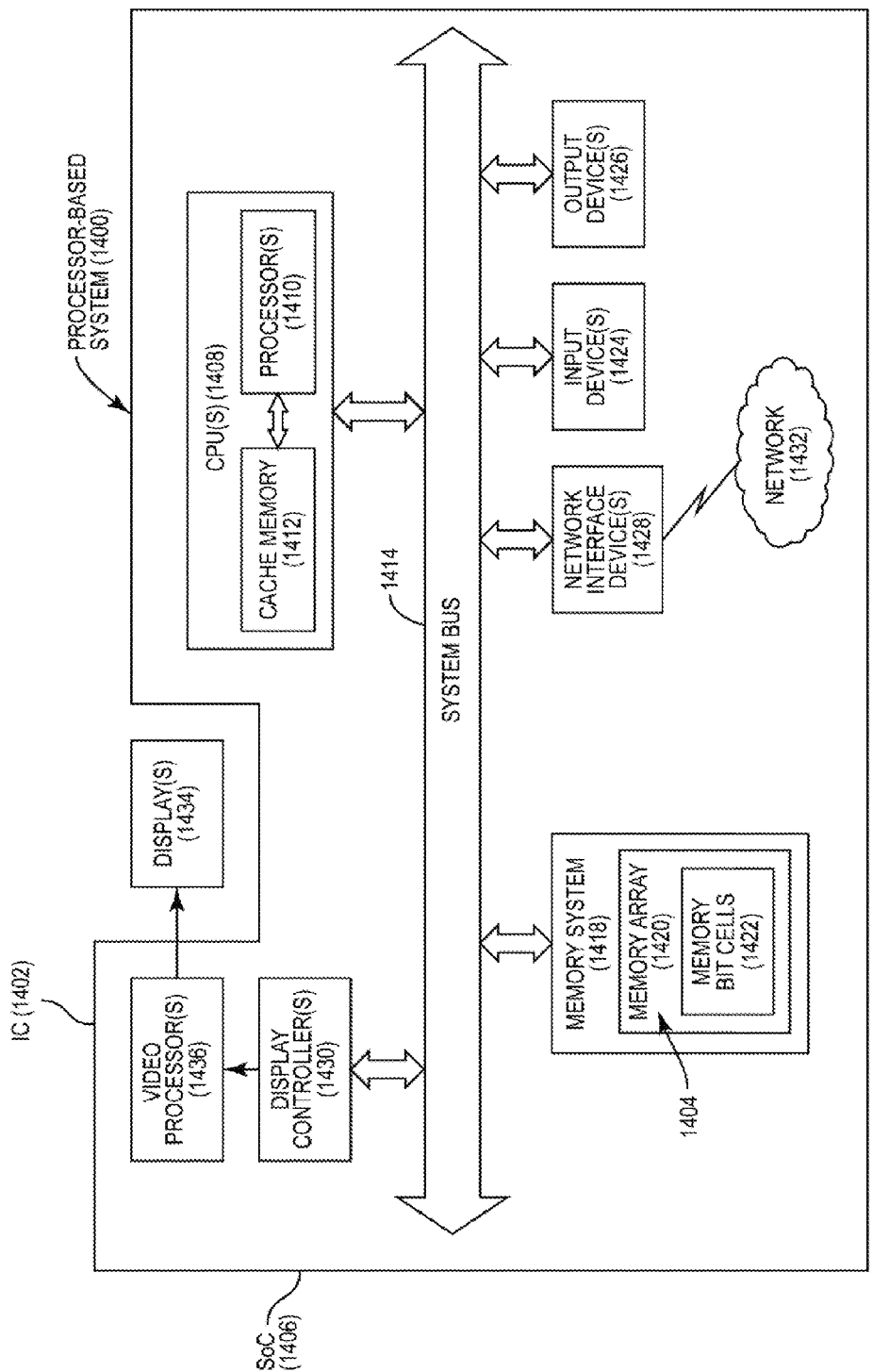
FIG. 14 is a block diagram of an exemplary processor-based system that can include a memory system that includes an MRAM array, an MRAM bit cell PVMC configured to determine MTJ and logic process variations representing MTJ and logic process variations in MRAM bit cells in the MRAM array, and a power management circuit configured to dynamically control a supply voltage provided to the MRAM array for access operations to account for such process variations, including but not limited to the memory systems in FIG. 4 and FIG. 7, and the PVMCs in FIGS. 8-13C.

In this regard, FIG. 14 illustrates an example of a processor-based system 1400 that can be included in an IC 1402 including process variation measurement circuits 1404 to allow for dynamically generating a supply voltage at a desired voltage level for access operations to MRAM bit cells to account for process variations therein. The IC 1402 may be included in or provided as a SoC 1406. The processor-based system 1400 includes a CPU 1408 that includes one or more processors 1410. The CPU 1408 may have a cache memory 1412 coupled to the processor(s) 1410 for rapid access to temporarily stored data. The CPU 1408 is coupled to a system bus 1414 and can intercouple master and slave devices included in the processor-based system 1400. As is well known, the CPU 1408 communicates with these other devices by exchanging address, control, and data information over the system bus 1414. Although not illustrated in FIG. 14, multiple system buses 1414 could be provided, wherein each system bus 1414 constitutes a different fabric. For example, the CPU 1408 can communicate bus transaction requests to a memory system 1418 as an example of a slave device. The memory system 1418 may include a memory array 1420 that includes memory bit cells 1422. The memory bit cells 1422 may be MRAM bit cells for example.

Other master and slave devices can be connected to the system bus 1414. As illustrated in FIG. 14, these devices can include the memory system 1418, and one or more input devices 1424. The input device(s) 1424 can include any type of input device, including but not limited to input keys, switches, voice processors, etc. The other devices can also include one or more output devices 1426, and one or more network interface devices 1428. The output device(s) 1426 can include any type of output device, including but not limited to audio, video, other visual indicators, etc. The other devices can also include one or more display controllers 1430 as examples. The network interface device(s) 1428 can be any devices configured to allow exchange of data to and from a network 1432. The network 1432 can be any type of network, including but not limited to a wired or wireless network, a private or public network, a local area network (LAN), a wireless local area network (WLAN), a wide area network (WAN), a BLUETOOTH™ network, and the Internet. The network interface device(s) 1428 can be configured to support any type of communications protocol desired.

The CPU 1408 may also be configured to access the display controller(s) 1430 over the system bus 1414 to control information sent to one or more displays 1434. The display controller(s) 1430 sends information to the display(s) 1434 to be displayed via one or more video processors 1436, which process the information to be displayed into a format suitable for the display(s) 1434. The display(s) 1434 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A magneto-resistive random access memory (MRAM) bit cell process variation measurement circuit (PVMC) for determining process variation in MRAM bit cells in an MRAM array, the MRAM bit cell PVMC comprising:
   a supply voltage input configured to receive a supply voltage coupled to the MRAM array; and
   a magnetic tunnel junction (MTJ) PVMC coupled to the supply voltage input, the MTJ PVMC comprising:
      one or more MTJ circuits, each comprising:
         a measurement transistor of a metal oxide semiconductor (MOS) type of an access transistor in at least one MRAM bit cell in the MRAM array; and a measurement MTJ device of a type of an MTJ device in the at least one MRAM bit cell in the MRAM array, the measurement MTJ device coupled to the measurement transistor; and an MTJ measurement output;

the MTJ PVMC configured to generate, on the MTJ measurement output, a process variation measurement voltage signal representing process variation in the measurement transistor and the measurement MTJ device of the one or more MTJ circuits, representing process variation of the access transistor and the MTJ device in the at least one MRAM bit cell in the MRAM array, as a function of the supply voltage coupled to the MTJ PVMC.

2. The MRAM bit cell PVMC of claim 1, wherein, for at least one MTJ circuit of the one or more MTJ circuits:

the measurement MTJ device further comprises a pinned layer, a free layer, and a tunnel barrier disposed between the pinned layer and the free layer; and the measurement transistor is coupled to the pinned layer of the measurement MTJ device.

3. The MRAM bit cell PVMC of claim 2, wherein, for the at least one MTJ circuit of the one or more MTJ circuits:

the measurement transistor further comprises a gate, a drain, and a source;

the drain of the measurement transistor is coupled to the pinned layer of the measurement MTJ device;

the free layer of the measurement MTJ device is coupled to the supply voltage input; and the source of the measurement transistor is coupled to a ground node.

4. The MRAM bit cell PVMC of claim 2, wherein, for the at least one MTJ circuit of the one or more MTJ circuits:

the measurement transistor further comprises a gate, a drain, and a source;

the drain of the measurement transistor is coupled to the pinned layer of the measurement MTJ device;

the free layer of the measurement MTJ device is coupled to a ground node; and the source of the measurement transistor is coupled to the supply voltage input.

5. The MRAM bit cell PVMC of claim 1, wherein, for at least one MTJ circuit of the one or more MTJ circuits:

the measurement MTJ device further comprises a pinned layer, a free layer, and a tunnel barrier disposed between the pinned layer and the free layer; and the measurement transistor is coupled to the free layer of the measurement MTJ device.

6. The MRAM bit cell PVMC of claim 5, wherein, for the at least one MTJ circuit of the one or more MTJ circuits:

the measurement transistor further comprises a gate, a drain, and a source;

the drain of the measurement transistor is coupled to the free layer of the measurement MTJ device;

the pinned layer of the measurement MTJ device is coupled to the supply voltage input; and the source of the measurement transistor is coupled to a ground node.

7. The MRAM bit cell PVMC of claim 5, wherein, for the at least one MTJ circuit of the one or more MTJ circuits:

the measurement transistor further comprises a gate, a drain, and a source;

the drain of the measurement transistor is coupled to the free layer of the measurement MTJ device;

the pinned layer of the measurement MTJ device is coupled to a ground node; and the source of the measurement transistor is coupled to the supply voltage input.

8. The MRAM bit cell PVMC of claim 5, wherein, for at least one other MTJ circuit of the one or more MTJ circuits:

the measurement MTJ device further comprises the pinned layer, the free layer, and the tunnel barrier disposed between the pinned layer and the free layer; and the measurement transistor is coupled to the pinned layer of the measurement MTJ device.

9. The MRAM bit cell PVMC of claim 1, wherein the MRAM bit cell PVMC comprises an MTJ ring oscillator comprising the one or more MTJ circuits, wherein the MTJ ring oscillator comprises:

an odd number of at least three (3) of the one or more MTJ circuits each comprising an MTJ input node and an MTJ output node, the at least three (3) of the one or more MTJ circuits each comprising:

the measurement transistor comprising a gate, a source, and a drain;

the measurement MTJ device comprising a pinned layer, a free layer, and a tunnel barrier disposed between the pinned layer and the free layer;

the free layer of the measurement MTJ device coupled to the supply voltage input;

the source of the measurement transistor coupled to a ground node; and the drain of the measurement transistor coupled to the pinned layer of the measurement MTJ device and the gate of the measurement transistor in a succeeding MTJ circuit in the at least three (3) of the one or more MTJ circuits; and the MTJ measurement output coupled to the gate of the measurement transistor in a first MTJ circuit of the at least three (3) of the one or more MTJ circuits.

10. The MRAM bit cell PVMC of claim 1, wherein the MRAM bit cell PVMC comprises an MTJ ring oscillator comprising the one or more MTJ circuits, wherein the MTJ ring oscillator comprises:

an odd number of at least three (3) of the one or more MTJ circuits each comprising an MTJ input node and an MTJ output node, the at least three (3) of the one or more MTJ circuits each comprising:

the measurement transistor comprising a gate, a source, and a drain;

the measurement MTJ device comprising a pinned layer, a free layer, and a tunnel barrier disposed between the pinned layer and the free layer;

the pinned layer of the measurement MTJ device coupled to the supply voltage input;

the source of the measurement transistor coupled to a ground node; and the drain of the measurement transistor coupled to the free layer of the measurement MTJ device and the gate of the measurement transistor in a succeeding MTJ circuit in the at least three (3) of the one or more MTJ circuits; and the MTJ measurement output coupled to the gate of the measurement transistor in a first MTJ circuit of the at least three (3) of the one or more MTJ circuits.

11. The MRAM bit cell PVMC of claim 1, wherein the MRAM bit cell PVMC comprises an MTJ ring oscillator comprising the one or more MTJ circuits, wherein the MTJ ring oscillator comprises:

an odd number of at least three (3) of the one or more MTJ circuits each comprising an MTJ input node and an MTJ output node, the at least three (3) of the one or more MTJ circuits each comprising:
the measurement transistor comprising a gate, a source, and a drain;
the measurement MTJ device comprising a pinned layer, a free layer, and a tunnel barrier disposed between the pinned layer and the free layer;
the free layer of the measurement MTJ device coupled to a ground node;
the source of the measurement transistor coupled to the supply voltage input; and
the drain of the measurement transistor coupled to the pinned layer of the measurement MTJ device and the gate of the measurement transistor in a succeeding MTJ circuit in the at least three (3) of the one or more MTJ circuits; and
the MTJ measurement output coupled to the gate of the measurement transistor in a first MTJ circuit of the at least three (3) of the one or more MTJ circuits.

12. The MRAM bit cell PVMC of claim 1, wherein the MRAM bit cell PVMC comprises an MTJ ring oscillator comprising the one or more MTJ circuits, wherein the MTJ ring oscillator comprises:
an odd number of at least three (3) of the one or more MTJ circuits each comprising an MTJ input node and an MTJ output node, the at least three (3) of the one or more MTJ circuits each comprising:
the measurement transistor comprising a gate, a source, and a drain;
the measurement MTJ device comprising a pinned layer, a free layer, and a tunnel barrier disposed between the pinned layer and the free layer;
the pinned layer of the measurement MTJ device coupled to a ground node;
the source of the measurement transistor coupled to the supply voltage input; and
the drain of the measurement transistor coupled to the free layer of the measurement MTJ device and the gate of the measurement transistor in a succeeding MTJ circuit in the at least three (3) of the one or more MTJ circuits; and
the MTJ measurement output coupled to the gate of the measurement transistor in a first MTJ circuit of the at least three (3) of the one or more MTJ circuits.

13. The MRAM bit cell PVMC of claim 1, further comprising:
a logic PVMC coupled to the supply voltage input, the logic PVMC comprising:
one or more logic circuits each comprising a second measurement transistor of the MOS type of the access transistor in the at least one MRAM bit cell in the MRAM array; and
a logic measurement output;
the logic PVMC configured to generate, on the logic measurement output, a logic process variation measurement voltage signal representing process variation in the second measurement transistor representing process variation of the access transistor in the at least one MRAM bit cell in the MRAM array, as a function of the supply voltage coupled to the logic PVMC.

14. The MRAM bit cell PVMC of claim 13, wherein the logic PVMC comprises a logic ring oscillator, wherein the logic ring oscillator comprises an odd number of the one or more logic circuits comprising at least three (3) inverting logic circuits each comprising a logic input node and a logic output node, the at least three (3) inverting logic circuits each configured to:
receive a logic input voltage on the logic input node from the logic output node of a preceding inverting logic circuit among the at least three (3) inverting logic circuits; and
generate a logic output voltage on the logic output node based on an inversion operation of the logic input voltage;
wherein the logic measurement output is coupled to the logic output node of a last inverting logic circuit among the at least three (3) inverting logic circuits.

15. The MRAM bit cell PVMC of claim 13, wherein:
the measurement transistor of the one or more MTJ circuits comprises an N-type MOS (NMOS) transistor; and
the one or more logic circuits comprise one or more NAND-based logic circuits.

16. The MRAM bit cell PVMC of claim 13, wherein:
the measurement transistor of the one or more MTJ circuits comprises a P-type MOS (PMOS) transistor; and
the one or more logic circuits comprise one or more NOR-based logic circuits.

17. The MRAM bit cell PVMC of claim 1 integrated into an integrated circuit (IC).

18. The MRAM bit cell PVMC of claim 1 integrated into a system-on-a-chip (SoC).

19. The MRAM bit cell PVMC of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

20. A magneto-resistive random access memory (MRAM) bit cell process variation measurement circuit (PVMC) comprising:
a means for coupling a supply voltage coupled to an MRAM array, to a means for measuring magnetic tunnel junction (MTJ) process variation;
the means for measuring MTJ process variation comprising:
a means for generating an MTJ process variation measurement indicator representing process variation in a measurement transistor and process variation in a measurement MTJ device, representing process variation of an access transistor and an MTJ device in at least one MRAM bit cell in the MRAM array, as a function of the supply voltage.

21. A method of measuring process variation of magneto-resistive random access memory (MRAM) bit cells in an MRAM array, comprising:
receiving a supply voltage coupled to the MRAM array;
coupling the supply voltage from a supply voltage input to a magnetic tunnel junction (MTJ) process variation measurement circuit (PVMC), comprising one or more MTJ circuits each comprising:

a measurement transistor of a metal oxide semiconductor (MOS) type of an access transistor in at least one MRAM bit cell in the MRAM array;
a measurement MTJ device of a type of an MTJ device in the at least one MRAM bit cell in the MRAM array, the measurement MTJ device coupled to the measurement transistor; and
generating a process variation measurement voltage signal representing process variation in the measurement transistor and the measurement MTJ device of the one or more MTJ circuits, representing process variation of the access transistor and the MTJ device in the at least one MRAM bit cell in the MRAM array, as a function of the supply voltage coupled to the MTJ PVMC.

22. The method of claim 21, wherein, for at least one MTJ circuit of the one or more MTJ circuits:
the measurement MTJ device further comprises a pinned layer, a free layer, and a tunnel barrier disposed between the pinned layer and the free layer; and
the measurement transistor is coupled to the pinned layer of the measurement MTJ device.

23. The method of claim 21, wherein, for at least one MTJ circuit of the one or more MTJ circuits:
the measurement MTJ device further comprises a pinned layer, a free layer, and a tunnel barrier disposed between the pinned layer and the free layer; and
the measurement transistor is coupled to the free layer of the measurement MTJ device.

24. The method of claim 21, further comprising:
coupling the supply voltage from the supply voltage input to a logic PVMC comprising one or more logic circuits each comprising a second measurement transistor of the MOS type of the access transistor in the at least one MRAM bit cell in the MRAM array; and
generating a logic process variation measurement voltage signal representing process variation in the second measurement transistor of the one or more logic circuits, representing process variation of the access transistor in the at least one MRAM bit cell in the MRAM array, as a function of the supply voltage coupled to the logic PVMC.

25. A memory system, comprising:
a power management circuit configured to generate a supply voltage;
a magneto-resistive random access memory (MRAM) array coupled to the supply voltage, the MRAM array comprised of a plurality of MRAM bit cells, each MRAM bit cell among the plurality of MRAM bit cells comprising a magnetic tunnel junction (MTJ) device coupled to an access transistor; and
an MRAM bit cell process variation measurement circuit (PVMC) for determining process variation in the plurality of MRAM bit cells in the MRAM array, the MRAM bit cell PVMC comprising an MTJ PVMC comprising:
a supply voltage input configured to receive the supply voltage generated by the power management circuit;
one or more MTJ circuits each comprising:
a measurement transistor of a metal oxide semiconductor (MOS) type of the access transistor in at least one MRAM bit cell among the plurality of MRAM bit cells in the MRAM array; and
a measurement MTJ device of a type of the MTJ device in the at least one MRAM bit cell among the plurality of MRAM bit cells in the MRAM array, the measurement MTJ device coupled to the measurement transistor; and an MTJ measurement output;
the MTJ PVMC configured to generate, on the MTJ measurement output, a process variation measurement voltage signal representing process variation in the measurement transistor and the measurement MTJ device of the one or more MTJ circuits, representing process variation of the access transistor and the MTJ device in the at least one MRAM bit cell among the plurality of MRAM bit cells in the MRAM array, as a function of the supply voltage coupled to the MTJ PVMC;
the power management circuit further configured to:
receive the process variation measurement voltage signal from the MRAM bit cell PVMC;
determine a supply voltage level based on the received process variation measurement voltage signal; and
dynamically generate the supply voltage at the determined supply voltage level.

26. The memory system of claim 25, wherein the power management circuit is configured to determine the supply voltage level by being configured to:
determine a delay performance of the MRAM bit cell PVMC based on the received process variation measurement voltage signal; and
determine the supply voltage level based on the determined delay performance.

27. The memory system of claim 25, wherein the MRAM bit cell PVMC further comprises a logic PVMC coupled to the supply voltage input, the logic PVMC comprising:
one or more logic circuits each comprising a second measurement transistor of the MOS type of the access transistor in the at least one MRAM bit cell among the plurality of MRAM bit cells in the MRAM array; and
a logic measurement output;
wherein:
the logic PVMC is configured to generate, on the logic measurement output, a logic process variation measurement voltage signal representing process variation in the second measurement transistor representing process variation of the access transistor in the at least one MRAM bit cell among the plurality of MRAM bit cells in the MRAM array, as a function of the supply voltage coupled to the logic PVMC;
the power management circuit is further configured to receive the logic process variation measurement voltage signal from the logic PVMC; and
the power management circuit is further configured to determine the supply voltage level based on the received process variation measurement voltage signal and the received logic process variation measurement voltage signal.

28. The memory system of claim 27, wherein the power management circuit is configured to determine the supply voltage level by being configured to:
determine an MTJ delay performance of the MTJ PVMC based on the received process variation measurement voltage signal; and
determine a logic delay performance of the logic PVMC based on the received logic process variation measurement voltage signal.

29. The memory system of claim 28, wherein the power management circuit is configured to determine the supply voltage level by being configured to determine the supply voltage level based on the determined MTJ delay performance and the determined logic delay performance.

* * * * *